(12) United States Patent
Kryskowski

(10) Patent No.: US 10,439,119 B2
(45) Date of Patent: Oct. 8, 2019

(54) THERMOELECTRIC GENERATOR WITH MINIMAL THERMAL SHUNTING

(71) Applicant: UD HOLDINGS, LLC, Dearborn Heights, MI (US)

(72) Inventor: David Kryskowski, Ann Arbor, MI (US)

(73) Assignee: UD HOLDINGS, LLC, Dearborn Heights, MI (US)

( * ) Notice: Subject to any disclaimer, the term of this patent is extended or adjusted under 35 U.S.C. 154(b) by 0 days.

(21) Appl. No.: 15/036,584

(22) PCT Filed: Nov. 13, 2014

(86) PCT No.: PCT/US2014/065492
§ 371 (c)(1),
(2) Date: May 13, 2016

(87) PCT Pub. No.: WO2015/073694
PCT Pub. Date: May 21, 2015

(65) Prior Publication Data
US 2016/0276563 A1   Sep. 22, 2016

Related U.S. Application Data

(60) Provisional application No. 61/903,851, filed on Nov. 13, 2013.

(51) Int. Cl.
*H01L 35/02* (2006.01)
*H01L 35/32* (2006.01)
*H01L 35/14* (2006.01)

(52) U.S. Cl.
CPC .............. *H01L 35/02* (2013.01); *H01L 35/14* (2013.01); *H01L 35/32* (2013.01)

(58) Field of Classification Search
CPC .................................. H01L 35/32; H01L 35/00
(Continued)

(56) References Cited

U.S. PATENT DOCUMENTS

| 5,436,476 A | 7/1995 | Hynecek |
| 5,550,387 A | 8/1996 | Elsner et al. |

(Continued)

FOREIGN PATENT DOCUMENTS

| JP | 2003282961 A | 10/2003 |
| JP | 2006332398 A | 12/2006 |

(Continued)

OTHER PUBLICATIONS

International Search Report and Written Opinion for Application No. PCT/US2014/065492, dated Mar. 13, 2015, 12 pages.

(Continued)

*Primary Examiner* — Niki Bakhtiari
(74) *Attorney, Agent, or Firm* — Brooks Kushman P.C.

(57) ABSTRACT

In at least one embodiment, a thermoelectric generator is provided. The thermoelectric generator includes a substrate, a cap, a thermoelectric detector, and an insulation layer. The cap is attached to the substrate and includes an extending portion. The cap is configured to receive thermal energy from a heat generating device. The thermoelectric detector is in thermal communication with the cap to generate an electrical output in response to the thermal energy. The insulation layer is positioned between the cap and the substrate and the insulation layer is substantially co-planar with the extending portion of the cap.

18 Claims, 17 Drawing Sheets

(58) Field of Classification Search
USPC .................................................. 136/200–242
See application file for complete search history.

(56) References Cited

U.S. PATENT DOCUMENTS

| | | | |
|---|---|---|---|
| 5,914,488 A | 6/1999 | Sone | |
| 6,060,656 A | 5/2000 | Dresselhaus et al. | |
| 6,203,869 B1 | 3/2001 | Dougherty et al. | |
| 6,339,187 B1 | 1/2002 | Inoue | |
| 6,690,014 B1 | 2/2004 | Gooch et al. | |
| 7,038,234 B2 | 5/2006 | Ghamaty et al. | |
| 7,755,048 B2 | 7/2010 | Hsu | |
| 8,158,943 B2 | 4/2012 | Kryskowski et al. | |
| 8,803,127 B2 | 8/2014 | Kryskowski | |
| 2005/0218328 A1 | 10/2005 | Suzuki et al. | |
| 2009/0032080 A1* | 2/2009 | Kawauchi | H01L 35/32 136/224 |
| 2009/0095908 A1 | 4/2009 | Bollhorst | |
| 2010/0031992 A1 | 2/2010 | Hsu | |
| 2010/0051810 A1 | 3/2010 | Herrmann et al. | |
| 2011/0168978 A1 | 7/2011 | Kochergin | |
| 2011/0174978 A1 | 7/2011 | Forg et al. | |
| 2011/0175145 A1 | 7/2011 | Tsuji et al. | |
| 2013/0248712 A1 | 9/2013 | Abdolvand et al. | |

FOREIGN PATENT DOCUMENTS

| | | |
|---|---|---|
| JP | 2010204112 A | 9/2010 |
| JP | 2012058212 A | 3/2012 |
| WO | 2010120447 A1 | 10/2010 |
| WO | 2012051060 A2 | 4/2012 |
| WO | 2013155181 A1 | 10/2013 |

OTHER PUBLICATIONS

International Preliminary Report for Application No. PCT/US2014/065492, dated May 26, 2016, 9 pages.
International Search Report and Written Opinion for Application No. PCT/US2013/035971, dated Jul. 26, 2013, 11 pages.
International Preliminary Report for Application No. PCT/US2013/035971, dated Mar. 21, 2014, 19 pages.

* cited by examiner

THERMOELECTRIC GENERATOR WITH MINIMAL THERMAL SHUNTING

CROSS-REFERENCE TO RELATED APPLICATIONS

This application is the U.S. national phase of PCT Application No. PCT/US2014/065492 filed on Nov. 13, 2014, which claims the benefit of U.S. provisional Application No. 61/903,851 filed on Nov. 13, 2013, the disclosures of which are hereby incorporated in their entirety by reference herein.

TECHNICAL FIELD

Embodiments described herein generally relate to a thermoelectric generator with minimal thermal shunting.

BACKGROUND

An infrared (IR) detector is generally defined as a photodetector that responds to IR radiation. One type of an infrared detector is a thermal based detector. A thermal based detector may be implemented within a camera to generate an image of an object formed on the thermal properties generally associated with such an object. Thermal based detectors are known to include bolometers, microbolometers, pyroelectric, and thermopiles. The thermopiles may generate a DC voltage for sensing and/or electrical generation. Thermopiles may include a number of thermocouples that convert radiative energy from the object into electrical energy. The following references may be relevant to the present disclosure: U.S. Pat. No. 5,436,476 to Hynecek, U.S. Pat. No. 5,550,387 to Elsner et al., U.S. Pat. No. 6,060,656 to Dresselhaus et al., U.S. Pat. No. 6,690,014 to Gooch et al., U.S. Pat. No. 7,038,234 to Ghamaty et al., U.S. Pat. No. 7,755,048 to Hsu, and U.S. Patent Publication No. 2011/0168978 to Kochergin.

SUMMARY

In at least one embodiment, a thermoelectric generator is provided. The thermoelectric generator includes a substrate, a cap, a thermoelectric detector, and an insulation layer. The cap is attached to the substrate and includes an extending portion. The cap is configured to receive thermal energy from a heat generating device. The thermoelectric detector is in thermal communication with the cap to generate an electrical output in response to the thermal energy. The insulation layer is positioned between the cap and the substrate and the insulation layer is substantially co-planar with the extending portion of the cap.

In at least one embodiment, a thermoelectric generator is provided. The thermoelectric generator includes a substrate, a cap, a thermoelectric detector and an insulation layer. The cap is supported by the substrate and is configured to receive thermal energy from a heat generating device. The thermoelectric detector is in thermal communication with the cap to generate an electrical output in response to the thermal energy. The insulation layer is positioned between the cap and the substrate and the insulation layer is positioned on a same plane of a portion of the cap.

In at least one embodiment, a thermoelectric generator is provided. The thermoelectric generator includes a substrate, a cap, a thermoelectric detector and an insulation layer. The cap is positioned over the substrate and includes an extending portion. The cap is configured to receive thermal energy from a heat generating device. The thermoelectric detector is in thermal communication with the cap to generate an electrical output in response to the thermal energy. The insulation layer is positioned between the cap and the substrate and the insulation layer is substantially co-planar with the extending portion of the cap.

BRIEF DESCRIPTION OF THE DRAWINGS

The embodiments are pointed out with particularity in the appended claims. However, other features of the various embodiments will become more apparent and will be best understood by referring to the following detailed description in conjunction with the accompany drawings in which:

DETAILED DESCRIPTION

Figure 1:
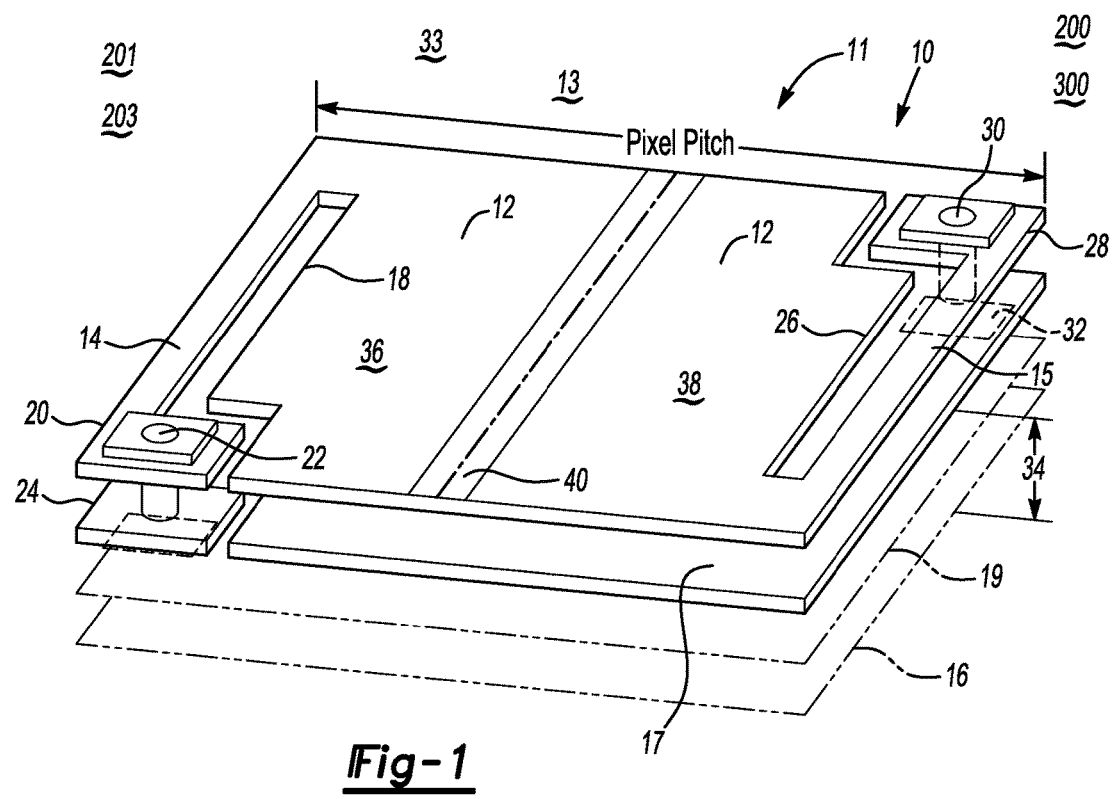
FIG. 1 depicts a thermoelectric detector in accordance to one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Various embodiments as disclosed herein, generally provide for, a thermoelectric generator (or radiative thermoelectric generator) that include a wafer level cap that receives thermal energy from a heat generating source (e.g., sun, solar, hot pipe, muffler, etc.). The wafer level cap may or may not be coupled to the heat generating source. In a TEG implementation, the wafer level cap may be coupled to the heat generating source (e.g., hot pipe, muffler, etc.) such that a portion of an absorber, and/or other aspects of a thermal electric detector is attached to the cap to enable thermal transfer to superlattice quantum well materials which convert the received thermal energy into an electrical output for storage on a storage device. In an RTEG implementation, the superlattice quantum well materials may receive the directly or indirectly from the sun or other heat generating source of electromagnetic radiation to produce electrical energy to power another device (or first device). With the RTEG implementation, the cap may not be coupled to the heat generating source. In addition, a reflector is positioned within the thermoelectric generator and includes Palladium or various alloys of Palladium. These aspects and others will be discussed in more detail herein.

The various embodiments disclosed herein, may provide, but not limited to, a plurality of detectors that may be positioned in an array of M×N columns exchanging energy with the environment to either generate electricity or pump heat from or two the environment to the detectors. In another embodiment, the plurality of detectors may be used to capture (or sense) thermal energy from a light source (or scene) and to provide an electrical output based on the sensed thermal energy for purposes of energy storage. The detector generally includes, among other things, an absorber, a substrate, and/or at least one arm. The absorber and/or the at least one arm may be suspended over the substrate. It is contemplated that the absorber and/or the at least one arm may be constructed of a superlattice quantum well thermoelectric based material. Such a construction may enable the absorber and the at least one arm to achieve increased Seebeck effect, low resistivity, and adequate thermal conductivity. These aspects may improve detector performance. It is also contemplated that the absorber and/or the arm may be encapsulated by, but not limited to, various silicon based dielectric materials such as silicon nitride and/or silicon dioxide. The encapsulation of the superlattice quantum well thermoelectric materials with the silicon based dielectric materials may stress compensate the detector and may increase the structural integrity of the detector while the absorber and/or the at least one arm are suspended over the substrate.

FIG. 1 depicts a thermoelectric detector (or detector hereafter) 10 in accordance to one embodiment of the present invention. The detector 10 may be one of many arranged in an M×N array 18 that is encapsulated in a vacuum 11 that may include an optical concentrator to form a Radiative ThermoElectric Generator (RTEG) 200. The RTEG 200 is generally arranged to sense thermal energy that is received directly or indirectly from the sun or other heat generating source of electromagnetic radiation to produce electrical energy to power another device and/or to store electrical energy on a storage device 201 such as a battery in response to the thermal energy. The RTEG 200 will be discussed in more detail below.

It is also recognized that the detector 10 may also be one or many arranged in the M×N array 18 to form a Thermo-Electric Generator (TEG) 300. The TEG 300 may or may not be encapsulated in the vacuum 11. The TEG 300 generally includes a portion thereof that is coupled to a heat generating source to receive thermal energy. The electrical energy may be used for generating electrical energy in response to the thermal energy for powering another device 201 and/or for storing electrical energy on the storage device 203 such as a battery. The TEG 300 will also be discussed in more detail below.

Each detector 10 is configured to absorb/emit electromagnetic radiation (hereafter radiation) from and/or to the environment outside of the detector 10 and to change its voltage potential based on an amount of energy exchanged from the environment. A readout integrated circuit (ROIC) 19 (or readout circuit) is positioned below each detector 10. The ROIC 19 may electrically output the voltage potential for each detector 10. It is contemplated that the ROIC 19 may comprise electrical connection lines or various electronics as generally found in complementary metal oxide semiconductor (CMOS) integrated circuits. Each detector 10 may be micro-machined on top of the ROIC 19. The embodiments disclosed herein may also be incorporated in a detector as set forth in PCT application Serial No. PCT/US2010/028293 ("the '293 application"), entitled "INFRARED DETECTOR" filed on Mar. 23, 2010, which is hereby incorporated by reference in its entirety. The detector 10 is generally arranged as a micro-bridge. In one example, the detector 10 may be formed as a thermopile.

While the detector 10 as noted above may be used to exchange radiation from the environment or with objects that are either much hotter or much cooler than the substrate, the detector 10 also receives thermal energy from a light source, such as thermal energy received directly or indirectly from the sun. The detector 10 provides a voltage output in response to the thermal energy for providing electrical energy to power another device 201 or for storing electrical energy on a storage device 203 such as a battery or other suitable mechanism.

The detector 10 includes an absorber 12, a first arm 14, a second arm 15, and a substrate 16. The absorber 12, the first arm 14, and the second arm 15 may comprise thermoelectric materials and be formed with superlattice quantum well materials which will be described in more detail below. The substrate 16 may comprise, but not limited to, a monocrystalline silicon wafer or a silicon wafer. The substrate 16 may be connected to the ROIC 19. The absorber 12, the first arm 14, and the second arm 15 are generally suspended over the ROIC 19. The first arm 14 is positioned next to the absorber 12 and may extend, if desired (attached or unattached) along a first side 18 of the absorber 12 and terminate at a terminal end 20. A post 22 is coupled to the terminal end 20 of the first arm 14.

An input pad 24 of the ROIC 19 receives the post 22. The post 22 provides an electrical connection from the absorber 12 to the ROIC 19. In a similar manner, the second arm 15 is positioned next to the absorber 12 and may extend, if desired (attached or unattached) along a second side 26 of the absorber 12 and terminate at a terminal end 28. A post 30 is coupled to the terminal end 28 of the second arm 16. An input pad 32 of the ROIC 19 receives the post 30. The post 30 provides an electrical connection from the absorber 12 to the ROIC 19. In general, the posts 22 and 30 cooperate with one another to support the absorber 12, the first arm 14, and the second arm 15 above the substrate 16 (e.g., suspend the absorber 12, the first arm 14, and the second arm 15 above the substrate 16).

The absorber 12 is generally configured to exchange radiation from a scene and to change temperature in response thereto. The detector 10 may change its voltage potential based on the amount of radiation received from the scene. A reflector 17 is positioned between the absorber 12 and the ROIC 19. The reflector 17 may enhance the ability for the absorber 12 to absorb the radiation. For example, any thermal energy that is not absorbed by the absorber 12 may be reflected off of the reflector 17 and back to the absorber 12. The first arm 14 and the second arm 15 may be horizontally displaced from the absorber 12 to thermally isolate the absorber 12. It may be desirable to reduce thermal conduction to increase detector 10 performance. In addition, the absorber 12, first arm 14, and the second arm 15 may be vertically displaced from the substrate 16 and define an isolation gap 34 (or cavity) therebetween for thermally isolating one detector from additional detectors positioned within the array.

The detector 10 may comprise P-type materials on one side and N-type materials on another side. For example, the absorber 12 may be considered to include a first portion 36, a second portion 38, and an active region 40. The first arm 14 and the first portion 36 may be constructed from P-type materials. The second arm 15 and the second portion 38 may be constructed from N-type materials. The active region 40 electrically couples the P-type based elements (first arm 14 and the first portion 36) to the N-type based elements (second arm 15 and the second portion 38). The active region 40 includes a metal film and may have a gap formed therebetween.

Figure 2:
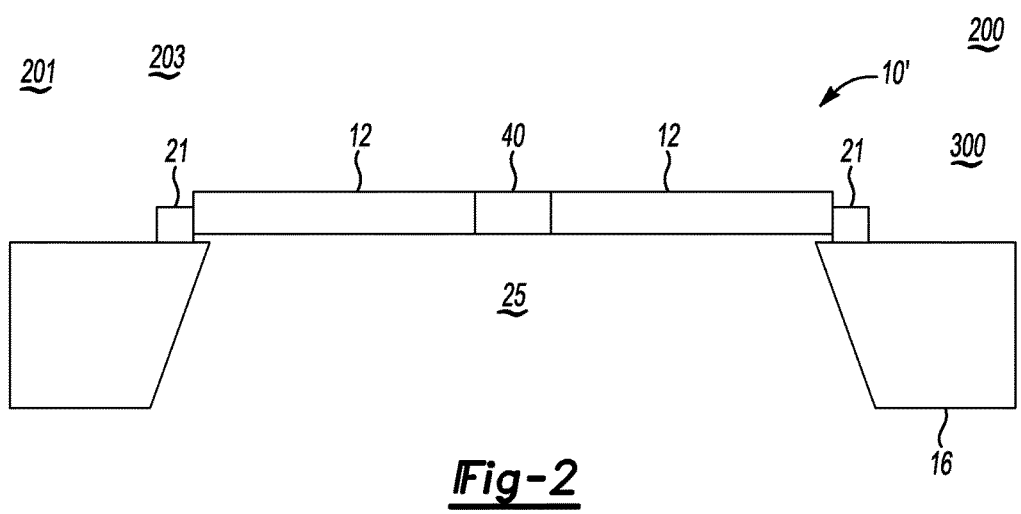
FIG. 2 depicts a cross-sectional view of a thermoelectric detector including only an absorber in accordance to one embodiment.

FIG. 2 depicts a cross-sectional view of a thermal detector 10' including only an absorber 12 in accordance to one embodiment. An electrical connection 21 is formed on each side of the detector 10' for providing an electrical output therefrom to a readout circuit (not shown). The absorber 12 is generally positioned (or suspended) over a cavity 25. It is recognized that the detector 10' may also be arranged in the array 18 to form the RTEG 200 or the TEG 300.

It is known to implement a detector that includes arms and an absorber being suspended over the substrate. In this conventional approach, the arms thermally isolate the absorber, which in turn causes a reduction in thermal conductance from the absorber to the substrate. By reducing thermal conductance between the absorber 12 and the arms 14, 15, heat transfer/leakage may be reduced and an improvement in IR detector performance may be realized. This conventional approach generally forms the thermoelectric structure (e.g., the arms and the absorber) with one or more of the following materials: bismuth-telluride, antimony-telluride, lead telluride, polysilicon, polysilicon-germanium, skutterudite, a nano-composite material, and a superlattice structure in order to achieve low thermal conductivity. By forming the detector with one or more of the aforementioned materials and by suspending the absorber and the arms, these conditions may cause the absorber and/or the arms to warp or buckle which may lead to a detector failure.

The embodiments described herein recognize, inter alia, that the absorber 12 and/or the arms 14, 15 as used in connection with an electrical generation support device that may be constructed with superlattice quantum well thermoelectric materials that may enable the detector 10 to realize adequate electrical output performance characteristics. Moreover, the embodiments disclosed herein contemplate encapsulating the superlattice quantum well materials of the absorber 12 and/or the arms 14, 15 with silicon nitride or silicon dioxide. The encapsulation of the absorber 12 and/or the arms 14, 15 with the silicon based materials may compensate or equalize stress that is induced during the deposition of the superlattice quantum well materials and increase the mechanical strength of the detector 10 while portions of the detector 10 are suspended over the ROIC 16. By increasing the mechanical strength of the detector 10 and by stress compensating the detector 10, warping or buckling of the detector 10 may be minimized or eliminated altogether. The embodiments further recognize that the absorber 12, the first arm 14, and the second arm 15 of the detector 10 may be constructed from superlattice (e.g., silicon/-silicon-germanium ($Si/Si_xGe_{1-x}$) where x may be an integer or a non-integer (hereafter "Si/SiGe")) quantum well thermoelectric materials. The first arm 14 and the first portion 36 may be formed of a P type superlattice quantum well thermoelectric material. The second arm 15 and the second portion 38 may be formed of an N type superlattice quantum well material.

By utilizing a superlattice quantum well detector 10 that includes the absorber 12 and/or arms 14, 15, such a condition minimizes thermal loss from the absorber 12 through the arms 14, 15 to substrate 16 and/or to any devices positioned proximate to the absorber 12, thereby thermally isolating the absorber 12 from a surrounding device. When radiation from the environment heats or cools the absorber 12, the detector 10 generates an output voltage that is proportional to the temperature difference between the absorber 12 and the substrate 16. Accordingly, if the absorber 12 was formed of material containing a high thermal conduction, detector performance may be adversely affected due to the leakage of thermal energy from the absorber 12. Because the superlattice quantum well material provides a low thermal conductivity, adequate thermal isolation at the absorber 12 may be achieved, thereby improving detector performance. In addition, superlattice quantum well materials also provide for a high Seebeck coefficient and high electrical conductivity which enables the detector 10 to provide an output voltage with a high signal-to-noise ratio which provides for a high fidelity representation of the amount of radiation sensed by absorber 12. Generally, the detector 10 is capable of providing a flow of current into the milliamp range.

While conventional detectors are known to include bismuth-telluride, antimony-telluride, lead telluride, polysilicon, polysilicon-germanium, skutterudite, a nano-composite material, and a superlattice structure as a means to achieve low thermal conductivity (i.e., minimize heat dissipation or transfer from the detector) for a suspended absorber and/or suspended arms, such materials may not provide sufficient mechanical support or not be properly stress compensated. It can be seen (as shown below) that the use of superlattice quantum well thermoelectric materials in the detector 10 may provide for adequate thermal conductivity and may serve as an alternate to the types of materials in conventional detectors.

In general, in order to obtain a large response from the detector 10, the thermal conductance from the detector 10 (e.g., absorber 12 and/or the arms 14, 15) to the thermal ground plane (e.g., within the substrate 16), $G_\kappa$, should be small. Therefore, the thermal conductivity of the thermoelectric materials should be as small as possible. Conclusively, it may be desirable for the material within the detector 10 to have (a) a high Seebeck coefficient and (b) a high electrical conductivity. A figure of merit for a thermoelectric materials made of n-type and p-type materials is defined as follows:

$$Z = \frac{(\alpha_p - \alpha_n)^2}{[(r_p k_p)^{1/2} + (r_n k_n)^{1/2}]^2} \quad (1)$$

Where:

$\alpha_p$=Seebeck constant for p-type material in $$\frac{\text{Volts}}{K}$$

$\alpha_n$=Seebeck constant for n-type material in $$\frac{\text{Volts}}{K}$$

$k_p$=Thermal conductivity for p-type material in $$\frac{\text{Watt}}{m \cdot K}$$

$k_n$=Thermal conductivity for n-type material $$\frac{\text{Watt}}{m \cdot K}$$

$\rho_p$=Resistivity of p-type material in $\Omega \cdot m$ $\rho_n$=Resistivity of n-type material in $\Omega \cdot m$ This figure of merit assumes that the arms 14, 15 have the same length and cross-sectional area. Table 1 (below) shows this new figure of merit for a selected group of materials. Performance improvement based on thermoelectric material choice may be evident.

Thermoelectric Material Type

TABLE 1

Thermocouple Material Performance Comparison

| | polysilicon | $Si_{0.7}Ge_{0.3}$ polysilicon | $Bi_2Te_3$/ $Sb_2Te_3$ | QW Si/SiGe |
|---|---|---|---|---|
| post-CMOS Compatible | NO | YES | YES | YES |
| Z $K^{-1}$ | $2.3 \times 10^{-4}$ | $1.0 \times 10^{-3}$ | $2.5 \times 10^{-3}$ | 0.31 |

For small pitch (e.g., ≤50 µm) arrays, $Bi_2Te_3$ and np $Si_{0.7}Ge_{0.3}$ may not be practical choices for the thermoelectric materials. The reason for rejecting standard np polysilicon is that its thermal conductivity may be too large to achieve reasonable detector sensitivities. Moreover, the deposition temperature may be too high for post Complementary Metal-Oxide-Semiconductor (CMOS) compatibility. The measurements of interest (e.g., resistivity, Seebeck coefficient, and thermal conductivity) for quantum well Si/SiGe, $Bi_2Te_3$, $Si_{0.7}Ge_{0.3}$ and standard np polysilicon are given below in the Table 2:

TABLE 2

$Bi_2Te_3/Sb_2Te_3$ Parameters, Polysilicon Parameters, QW Parameters

| Thermoelectric Material Type | Resistivity $\mu\Omega \cdot m$ | Seebeck $\frac{\mu V}{K}$ | $k \frac{W}{m \times K}$ |
|---|---|---|---|
| QW Si/SiGe (NP) | 0.1 to 10.0 | \|1200\| | 3-5 |
| $Bi_2Te_3$ (N) | 12.6 | −248 | 1.3 |
| $Sb_2Te_3$ (P) | 12.6 | 188 | 1.8 |
| $Bi_2Te_3$-$Bi_2Se_3$(N) | 15 | −200 | 1.2 |
| $Bi_2Te_3$-$Sb_2Te_3$(P) | 12 | 240 | 1.2 |
| $Si_{0.7}Ge_{0.3}$ polysilicon (NP) | 10 to 1000 | \|100\| to \|500\| | 5 |
| polysilicon (NP) | 10 to 1000 | \|100\| to \|500\| | 23 |

Although $Bi_2Te_3$ and $Sb_2Te_3$ can produce high performing thermoelectric material detectors, choosing $Bi_2Te_3$ and $Sb_2Te_3$ may have several drawbacks. For example, (1) detector resistance can fall around 3 k$\Omega$ and a consequence is that electronic noise may dominate; (2) deposition and etching of $Bi_2Te_3$ and $Sb_2Te_3$ is being heavily researched and may not be mature yet (however, $Bi_2Te_3$ and $Sb_2Te_3$ can be deposited at low temperatures, patterned and dry etched); and (3) the thermoelectric properties of $Bi_2Te_3$ and $Sb_2Te_3$ may vary greatly if the stoichiometry is not maintained which implies tight controls on the deposition and non-conventional deposition processes such as co-evaporation. In contrast, Si/SiGe superlattice quantum wells comprise widely used materials in CMOS and Micromechanical Systems (MEMS) processing. Moreover, stoichiometry may not be an issue in the Si/SiGe superlattice quantum well implementation, which may allow deposition to be conducted with less critical, controls.

The thermal conductivity of $Bi_2Te_3$ thin films has been measured to be $$1.2 \frac{W}{mK}$$

which may be close to the thermal conductivity of PECVD silicon nitride, where thermal conductivity may be $$\leq 1.18 \frac{W}{mK}.$$

The thermal conductivity of bulk $Bi_2Te_3$ may be $$1.7 \frac{W}{mK}$$

and the lower thermal conductivity may be a common effect in very thin films. The thermal conductivity of $Bi_2Te_3$ may fall further as the film thickness falls below 0.5 μm.

As shown above in Table 2, $Bi_2Te_3$ and silicon nitride may have similar thermal conductivities. Due to this fact, adding significant amounts of silicon nitride to the arms and/or to the absorber when formed of $Bi_2Te_3$ may cause a decrease in detector performance. Due to this condition, conventional implementations tend to avoid adding silicon nitride or silicon dioxide to bismuth telluride based detectors. In contrast, the arms 14, 15 and/or the absorber 12 of the present disclosure may include various amounts of silicon nitride and/or silicon dioxide with quantum well Si/SiGe. This condition may not cause a significant loss in detector performance because the thermal conductivity of quantum well Si/SiGe may be ≈3-4 times greater than that of silicon nitride. As such, the addition of the thermal conductivity added by the silicon nitride may be negligible in terms of the overall increase in thermal conductivity added to the Si/SiGe quantum well with the silicon nitride. For example, the thermal conductivity of Si/SiGe quantum well may be between 3-5 W/mK. The thermal conductivity of the silicon nitride may be 1.2 W/mK. Adding moderate amounts of the silicon nitride may not affect detector performance because the thermal conductivity of the Si/SiGe quantum well may dominate. In general, the thickness of the silicon nitride may be anywhere from 10% to 100% of the overall thickness of the quantum well arms 14, 15. For example, if the arms 14, 15 are 1000 Å thick, then the thickness of the silicon nitride may be in the range of 100 Å to 1000 Å. In general, the largest component of the total thermal conductance is due to the arms 14, 15.

Conventional based detectors that may implement a suspended arm and absorber structure tend to avoid encapsulating the arms and/or the absorber with silicon nitride when bismuth telluride materials are used to form the films in the detector to prevent an increase in thermal conductivity. However, it has been discovered as set forth herein, that by removing the encapsulated silicon nitride, such a condition may aid to the warping and/or buckling of the detector 10 as noted above. For example, the removal of the encapsulated silicon nitride may decrease detector mechanical strength and remove the capability to stress compensate. Unless the detector is stress compensated, the detector may warp and become non-functional.

Another useful dielectric in MEMS processing may be silicon dioxide. When deposited, silicon dioxide may normally be in compressive stress, this material in conjunction with silicon nitride can be used to compensate for stress and additionally may be an effective etch stop. The thermal conductivity of thin film silicon dioxide may be $$\leq 2.0 \frac{W}{mK}.$$

Figure 3:
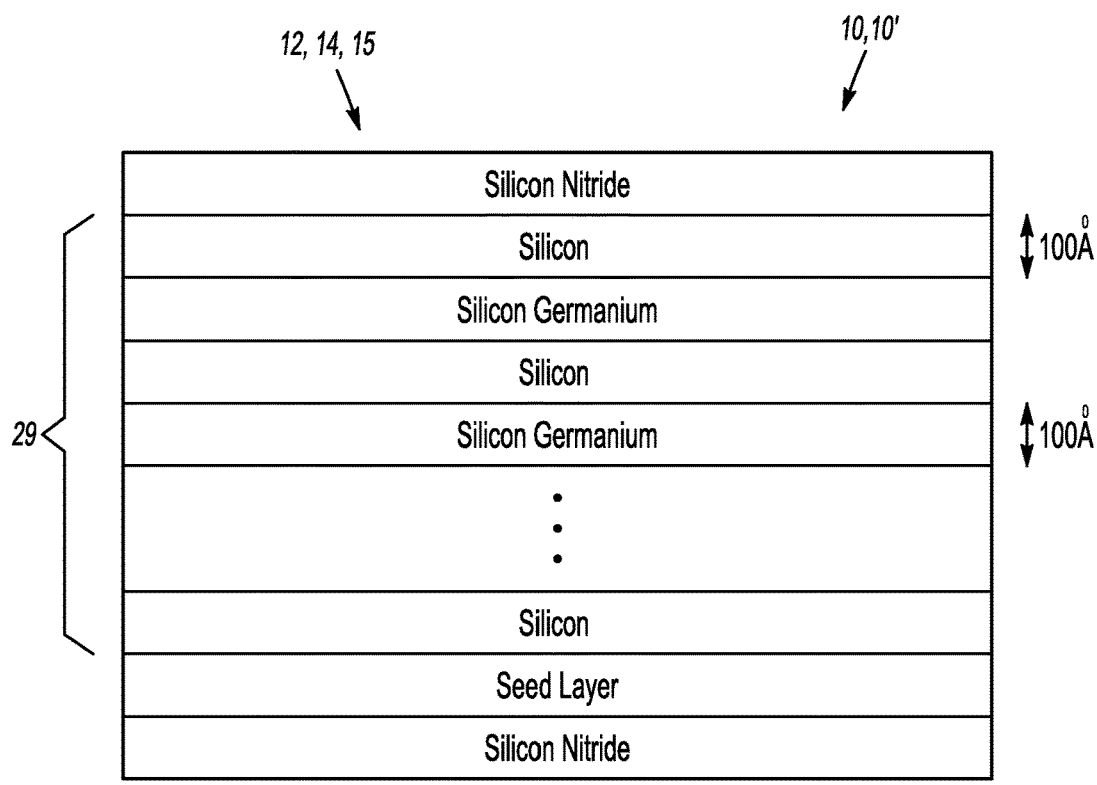
FIG. 3 depicts a superlattice quantum well thermoelectric material that is encapsulated by silicon based materials in accordance to one embodiment.

FIG. 3 depicts a superlattice quantum well thermoelectric material that is encapsulated by silicon based materials. In general, the superlattice quantum well layers of the absorber 12, and/or the arms 14, 15 and may be sandwiched between a top layer of silicon nitride and a bottom layer of silicon nitride (or sandwiched between a top layer of silicon dioxide and a bottom layer of silicon dioxide or sandwiched between a top layer of silicon nitride and a bottom layer of silicon dioxide (or vice versa) (see, element 29 in FIG. 3 alternating layers of Si/SiGe (e.g., barrier or conducting layers where the barrier layers comprise Si and the conducting layers comprise SiGe)). In reference to FIGS. 1-2, the first arm 14 and the first portion 36 may be formed a p-type superlattice quantum well that is encapsulated by silicon nitride. Conversely, the second arm 15 and the second portion 38 may formed of an n-type superlattice quantum well that is encapsulated by silicon nitride. A seed layer (not shown) is positioned above the silicon nitride layer and may be <100> monocrystalline silicon.

Figure 4A:
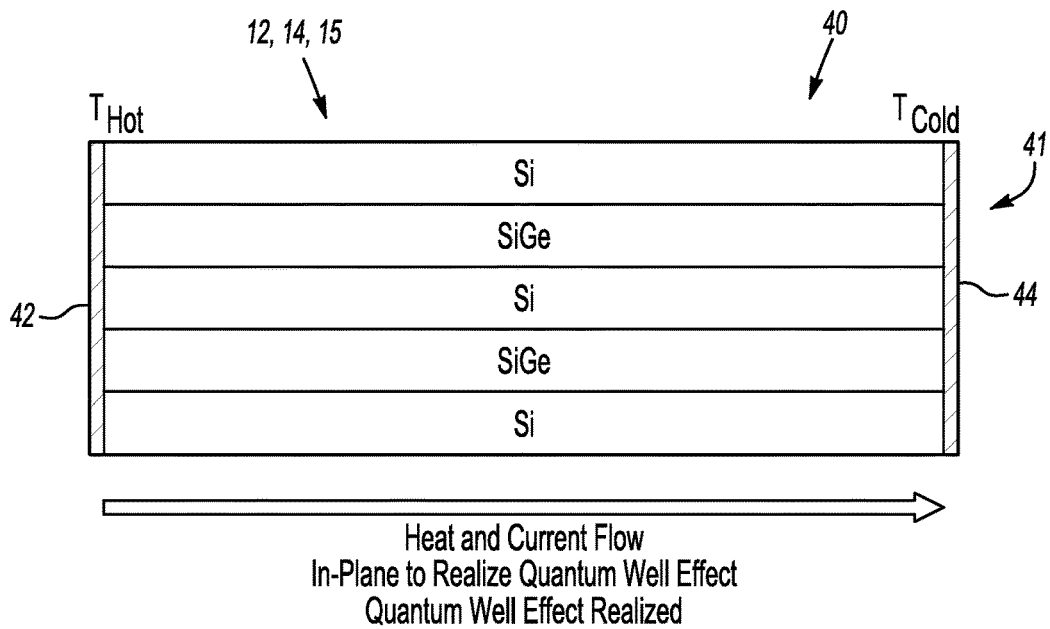
FIGS. 4A-4B depict one embodiment that realizes a quantum well and another embodiment that does not realize a quantum well effect; respectively.
Figure 4B:
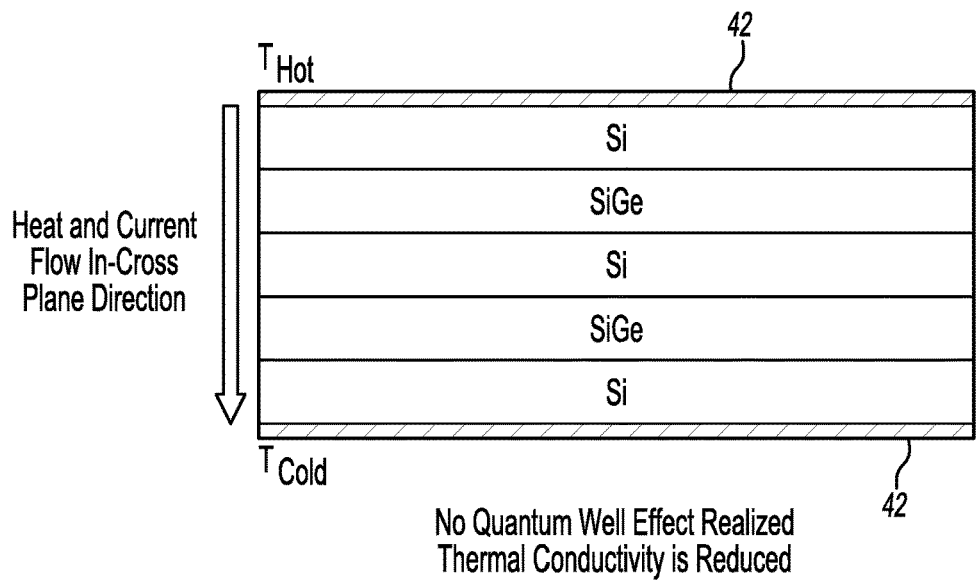

FIGS. 4A-4B depict one embodiment that realizes a quantum well effect and another embodiment that does not realize a quantum well effect, respectively. In reference to FIG. 4A a portion of the detector (e.g., first arm 14, second arm 15, and/or absorber 16) may include any number of films 41. The films 41 may comprise alternating layers of Si and Si/Ge (e.g., superlattice of Si and Si/Ge). Each layer of Si and Si/Ge may have a thickness of ≤200 Å. The total thickness of the quantum well material within the detector 10 may be ≤10000 Å. A first contact 42 is positioned on one end and a second contact 44 is positioned on another end. The first contact 42 may be horizontally positioned away from the second contact 44. By positioning the first contact 42 horizontally away from the second contact 44, small amounts of current and heat may flow laterally, from the first contact 42 through the layers of Si/SiGe to the second contact 44 (e.g., in plane). Such a condition enables the first arm 14, the second arm, and/or the absorber 16 to realize the quantum well effect.

One approach to increasing the performance of thermoelectric materials may be to form compositionally modulated materials, mainly by quantum well confinement of carriers in the active layers in a multilayer film by adjacent barrier layers. The approach as disclosed herein is to enclose each electrically active layer by a material which has a band offset sufficient to form a barrier for the charge carriers. An improvement in the thermoelectric properties (e.g., Seebeck effect, electrical resistivity and thermal conductivity) is expected to follow from an increase in the density of states (e.g., increased Seebeck), an increase in carrier mobility (e.g., lower electrical resistance), and inhibited phonon flow due to strain between the quantum well and barrier layers (e.g., lower thermal conductivity). The layer thicknesses may be ≤200 Å.

FIG. 4B depicts that the first contact 42 is vertically displaced from the second contact 44. Small amounts of current and heat may flow in a cross-plane direction which is perpendicular to the in-plane direction of the quantum well configuration noted above from the first contact 42 through the layers of Si/SiGe to the second contact 44. While thermal conductivity may be reduced, this implementation fails to realize the quantum well effect.

Figure 5:
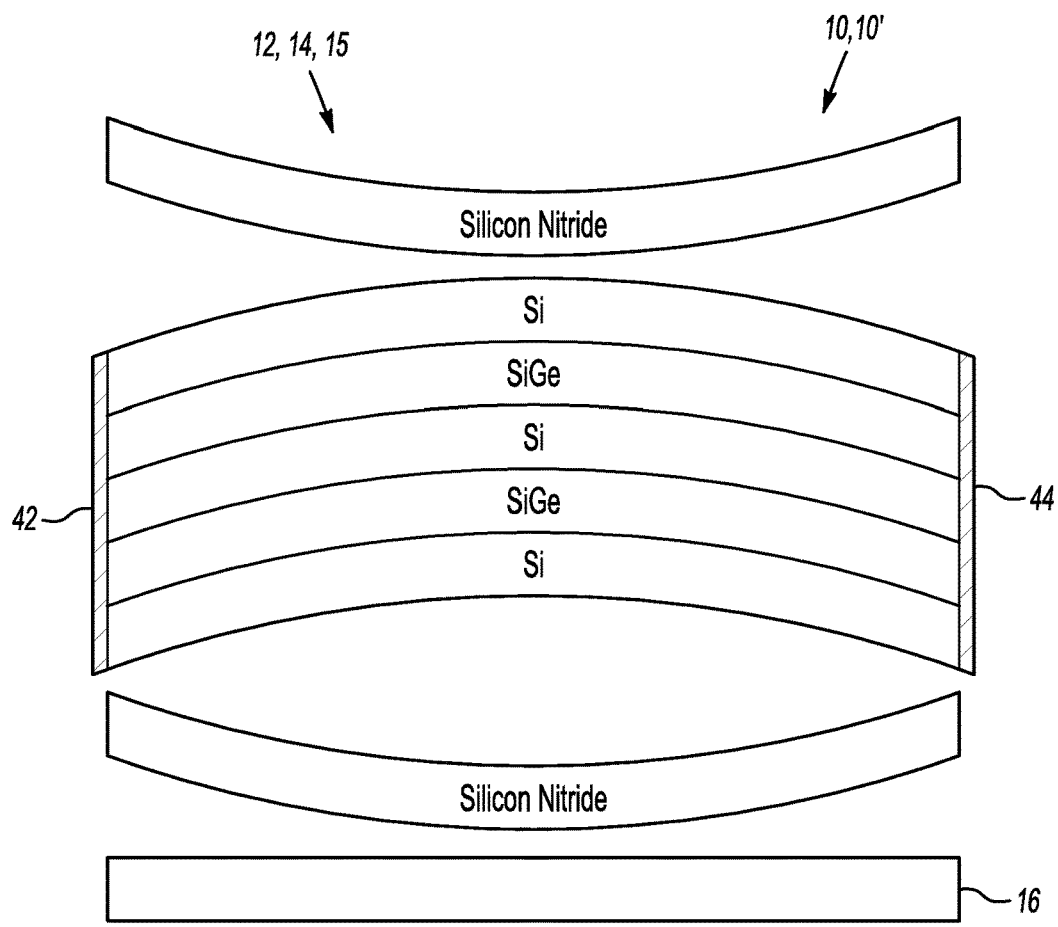
FIG. 5 depicts various stresses caused by layers of silicon nitride and the superlattice quantum well materials during deposition.

FIG. 5 depicts the various stresses caused by the layers of silicon nitride and the superlattice quantum well materials during deposition in one or more of the absorber 12 and/or in the arms 14, 15. For example, materials such as quantum well Si/SiGe when deposited, could be in a state of compressive stress. Under compressive stress, the various layers of Si and SiGe may expand with respect to the substrate 16. In this state of stress, the layers of Si and Si/Ge (either in the absorber 12 and/or in the arms 14, 15) when suspended and attached at two points (e.g., at the posts 22, 30), may buckle over the substrate 16.

The silicon nitride on the other hand, when deposited, could be in a state of tensile strength. Under tensile stress, each layer of silicon nitride may shrink with respect to the substrate 16. In this state of stress, each layer of silicon nitride when suspended and attached at two points (e.g., at the posts 22, 30), may be stretched by the substrate 16. By using predetermined thickness and deposition parameters for the silicon nitride and the quantum well Si/SiGe, a nearly stress free detector may be constructed. In general, due to the fact that the two stresses (e.g., compressive and tensile) are of opposite type, a nearly stress free thin film could be formed by combining the Si and Si/Ge layers to the silicon nitride layers. The thickness for each layer may depend on the magnitude of the stress in each layer.

In general, if the layers (e.g., layers of Si and Si/Ge and silicon nitride) of the detector 10 have equal and opposite stress levels, then the deposition of the layers on top of one another may produce a nearly stress free film. For example, let $\sigma_{m_1}$ represent the stress of material, $m_1$ (e.g., the layers of Si and Si/Ge) and $\sigma_{m_2}$ represent the stress of material, $m_2$ (e.g., the layers of silicon nitride). A material that is in tensile stress may have a positive value and a material in compressive stress may have a negative value. Let $t_1$ represent the thickness for a first set of layers (e.g., Si and Si/Ge) and $t_2$ represent the thickness for a second set of layers (e.g., silicon nitride). In order to produce a stress compensated detector 10, the following equation may need to be satisfied:

$$\sigma_{m_1} t_1 + \sigma_{m_2} t_2 = 0 \quad (3)$$

This expression may be easily generalized to more than two sets of layers.

As noted above, the quantum well Si/SiGe may be in a state of compressive stress when deposited and the silicon nitride may be in a state of tensile stress when deposited, the compressive stress caused by the deposition of the quantum well Si/SiGe may be offset by the tensile stress caused by the deposition of the silicon nitride which may result in a nearly stress free suspended detector implementation.

In general, each layer of SiGe may be n or p-type doped in the absorber 12 and/or in the arms 14, 15. The Si layers may not be doped and are therefore not electrically conductive. The doping concentration of one or more layers of the silicon germanium in the absorber 12 and/or in the arms 14, 15 is roughly between 5×10^18 to 5×10^19 atoms/cm^3. The doping concentration may not be the same for the n-type and p-type. The electrical resistance of the n-type arm and p-type arm should be the same to maximize the Seebeck effect this is why the doping concentration of the various layers of silicon germanium is different as it may be adjusted to achieve equivalent arm resistance. Moreover, as the doping concentration moves up, the electrical resistance goes down, but the Seebeck effect also goes down. The optimal doping concentration for the layer of silicon germanium is achieved to ensure that the electrical resistance is the same between the n-type and p-type arm and, moreover, to achieve maximum signal to noise ratio.

The use of the superlattice quantum well based thermoelectric materials in the detector 10 provide for, but not limited to, adequate thermal conductivity, increased Seebeck effect, and low resistivity which may increase detector performance. Encapsulating the superlattice quantum well based materials with silicon based materials (such as silicon nitride and/or silicon oxide or other suitable materials) may increase mechanical strength of the detector 10 and stress compensate offsetting stress caused by the various layers of the superlattice quantum well materials. In short, the present disclosure contemplates that the use of superlattice quantum well thermoelectric materials when combined with silicon based materials in the detector 10 may provide (i) increased detector performance due to the acceptable levels of thermal conductivity, increased Seebeck effect and low resistivity that have been discovered to be found in connection with the superlattice quantum well thermoelectric materials and (ii) increased mechanical strength/stress compensation caused by offsetting stress between the superlattice quantum well thermoelectric materials and the encapsulated silicon based materials.

In addition to the Si/SiGe quantum well system, other quantum well systems such as Si/SiC and $B_4C_4/B_9C_9$ may be used as well.

RTEG

As noted above, the implementation as illustrated in FIGS. 1 and 2 may be used in connection with the RTEG 200. In this case, the RTEG 200 may include a plurality of detectors 10 (or 10') arranged in the M×N array 18 that is encapsulated in the vacuum 11. The RTEG 200 is generally arranged to sense thermal energy that is received directly or indirectly from the sun or other source of radiation to produce electrical energy to power another device 201 and/or to store electrical energy on a storage device 203 such as a battery in response to the thermal energy.

In reference to back to FIG. 1, to maximize the efficiency of the RTEG 200, a vacuum 11 of between 1 and 10 mTorr may be needed to minimize the thermal conductive loss of the heat generated on the absorber 16. Although different contaminant gases may eventually outgas from materials inside the vacuum encapsulated environment, hydrogen is typically the dominant contaminant that may be outgassed from various materials within the vacuum encapsulated environment. In order to maintain a high vacuum environment, a getter (e.g., a material that may absorb the outgassing contaminants) may be placed inside the vacuum encapsulated environment to "get" or "absorb" the contaminant. It is recognized as set forth herein that Palladium and/or certain alloys of Palladium (e.g., Palladium-Silver) (collectively hereinafter "Palladium") may be used within the vacuum encapsulated environment to absorb the hydrogen.

Palladium as a Getter

The reflector 17 may include Palladium and may be placed directly under the absorber 16. The distance between the absorber 16 and the reflector 17 may be the smallest distance between the absorber 16 and the encapsulated environment (e.g., anywhere from 1 to 4 microns depending on the design). Thermal conductance of a gas contaminate, such as hydrogen, may increase as the distance of the absorber 16 and the reflector 17 decreases. In general, as the distance decreases in the presence of gas between the two plates, the thermal conductance increases as the plate separation decreases. As such, it may be preferable to place the Palladium at a point between the absorber 16 and the reflector 17 which provides the smallest distance between the absorber 16 and the reflector 17. In addition, the Palladium (or getter) may cover nearly an entire surface area of the M×N array 18 (e.g., increase surface area of the getter material) such that an increase of the overall effectiveness of the getter may be realized.

In addition to being an excellent hydrogen getter, Palladium (or specular finished Palladium) generally includes a high reflectivity of between 5 and 15 microns (e.g., >98%) thus providing an ideal material for the reflector 17. The "effective" emissivity of the back side of the absorber 16 is given by the following equation:

$$\epsilon_{eff} = \frac{1}{\frac{1}{\epsilon_{absorber}} + \frac{1}{\epsilon_{reflector}} - 1} \quad (4)$$

In the worst case, where the back side of the absorber's emissivity is unity ($\epsilon_{absorber}=1$), a Palladium based reflector 17 may cause the back of the absorber's effective emissivity to be 0.02 (assuming a 98% reflectance for the Palladium and using $\epsilon_{reflector}=1-0.98=0.02$) which may maintain a high temperature of the absorber 16 and may increase the electrical generation efficiency of the RTEG 200.

In addition to Palladium's getter and reflective properties, Palladium's melting temperature, 1555 C is much higher than the Aluminum alloys used for CMOS/MEMS processing (e.g., this is typically around 450 C). Because of the higher melting temperature, the processing steps that deposit the Si/SiGe quantum well materials may be performed at higher temperatures. Such a condition may improve overall RTEG 200 performance when used in connection with the micro-bridge construction technique of detector 10.

High Temperature Deposition of Quantum Well Materials

A post CMOS temperature restriction may be avoided by performing, but not limited to, the following: (a) avoid the use of CMOS circuitry and/or (b) modifying the CMOS process such that the quantum well material(s) can be deposited before materials, such as aluminum alloys, are deposited. Such materials generally exhibit a final low melting temperature. High temperature deposition of quantum well material may provide the following: (1) the temperature of the substrate may be raised above 450 C (or 650 C for example) that will allow the seed layer to better crystallize during deposition; (2) a larger deposition temperature may allow for more stress in the Si/SiGe quantum well material which may enable for a wider temperature range of operation (e.g., the wider temperature range of operation may be realized because stress can enhance the thermoelectric properties of the Si/SiGe quantum well material and stress may be maintained until the quantum well material approaches the temperature at which it was initially deposited); (3) if many quantum well layers are necessary for proper device operation, it is possible that the deposition of the quantum well material may begin to lose its short range crystalline ordering as more layers are added (e.g., access to high temperature processing may allow for a deposition of a new "seed layer" on top of the already deposited layer stack to "restart" the short term crystalline ordering to allow the subsequent layer stack to deposited with the proper degree of crystalline ordering); and (4) another approach to maintaining a proper short term crystalline ordering for quantum well structures with many layers may be to anneal the partially deposited stack at a high temperature to better crystallize the partially deposited quantum well stack and then finish the deposition after the annealing operation.

Electrical Connection

A function of the ROIC 19 may be to electrically combine the output of each of the detectors 10 or 10' (collectively 10 hereafter). For example, the detectors 10 in the M×N array 18 may be placed in series to produce a large voltage along with a small amount of current. Conversely, the detectors 10 may be placed in parallel to produce a large current with a small voltage. In either case, the available output power may be the same. Various series and parallel combinations may provide varying degrees of output voltage and output current. It may be beneficial to have a large voltage and a small current since the electrical connections may not be so large in order to carry a large amount of current.

Figure 6:
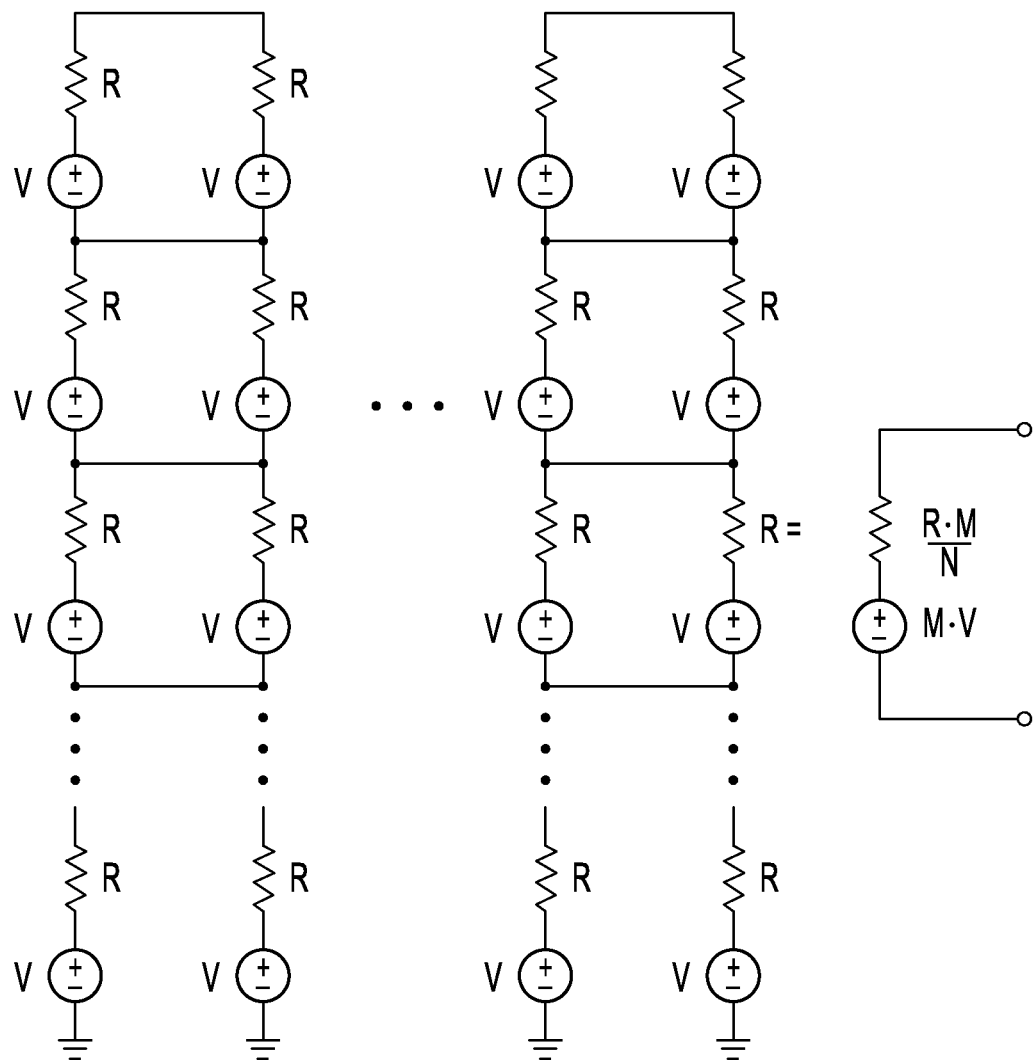
FIG. 6 depicts one electrical connection scheme for an M×N array in accordance to one embodiment.

FIG. 6 depicts one electrical connection scheme for the RTEG 200 formed by the M×N array 18. With this electrical connection scheme, the effective output voltage from the array 18 for a uniform radiation exchange of all the detectors may be M*V, where V is the output voltage of a single detector 10. The effective output resistance may be R*M/N. The total power available may be the open circuit voltage of the array, M*V, times the short circuit current of the array, N*V/R which is $M*N*V^2/R$ as expected.

The additional benefit of the example electrical connection as shown in FIG. 6 is that if any one detector were to malfunction, there may be multiple paths for current to continue to flow to enable the RTEG 200 to continue to function. In the event an entire row was to malfunction, then the RTEG 200 may become inoperable.

A number of different thermoelectric generator designs are being developed which may be used to convert waste heat or heat sources directly to electricity. Such designs may include waste heat recovery from diesel trucks as well as automobiles and thermoelectric power generators including space applications. Bi2Te3 alloys, PbTe alloys, and SiGe based materials may be used for power generation in remote locations, for example, in deep space probes or direct conversion in general. However, in most waste heat recovery and direct heat conversion applications, an improvement in the efficiency of the energy conversion process from heat into electricity may be needed. The efficiency of thermoelectric energy conversion devices may be limited by the performance of the materials, which is normally measured in terms of a Figure of Merit, Z.

The difficulty in using thermoelectric modules using QW materials is that heat and current must flow along the QW layers. This constraint may make constructing conventional thermoelectric modules difficult. Additionally, the approach used by the various entities may require nearly 1000 or more layers of QW material. The approach as set forth herein may utilize the principal of radiation exchange for heat transfer. This condition may allow for a much simpler mechanical construction and may be more efficient in QW material usage which may need only 10 to 100 layers of material at a cost savings of a factor of ten or more in the material manufacture process. The approach as set forth herein may also use thinner active layers in a series/parallel electrical configuration for increased voltage output to reduce current carrying requirements internal to the device.

The amount of power generated may be very small (e.g., microwatts to milliwatts) to power, for example, remote sensors. Moreover, since these devices are flat and similar in size and shape to conventional solar cells, large panels may be produced to generate kilowatts of electricity from a temperature differential where heat transfer to one side of the temperature differential may be radiative and the heat transfer on another side of the temperature differential may be conduction and/or convection. The sustainment costs of fielded systems may be reduced because waste heat is converted into usable energy in the form of electricity.

Figure 7:
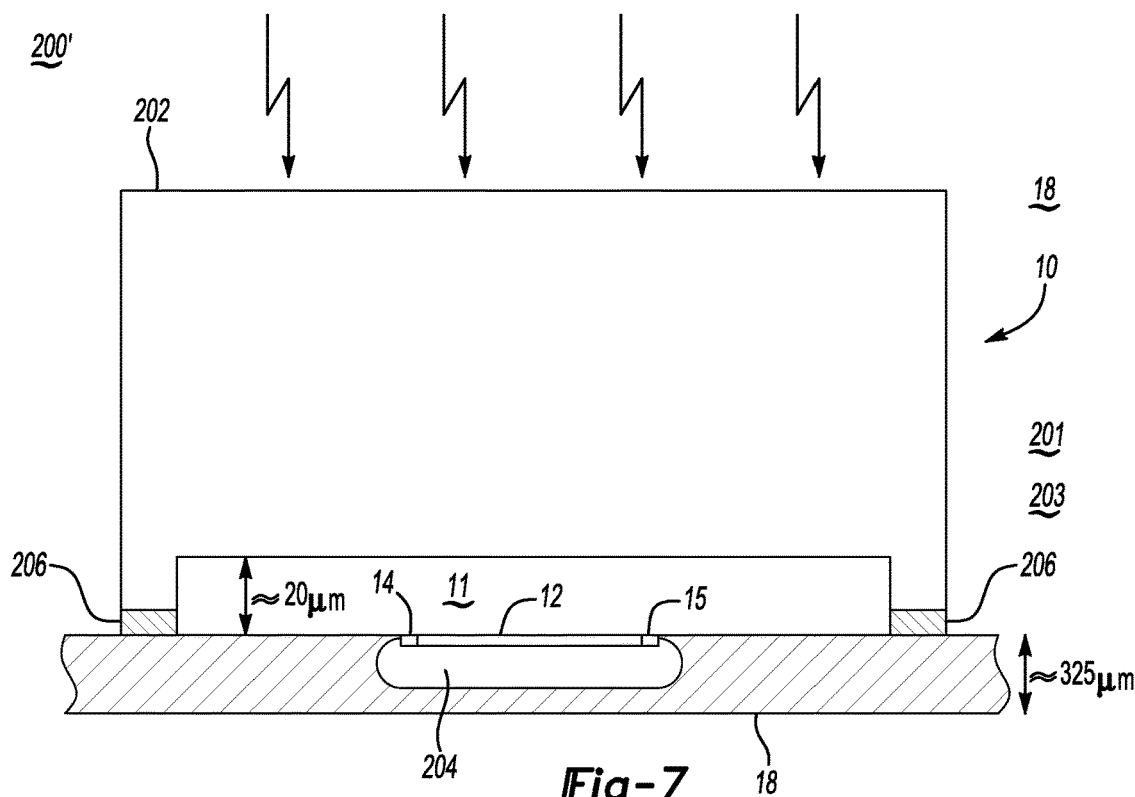
FIG. 7 depicts a detector in an RTEG in accordance to one embodiment.

FIG. 7 depicts a detector 10 in an RTEG 200' in accordance to one embodiment. The RTEG 200' includes any number of detectors 10 that are arranged in the array 18. The detector 10 includes the absorber 12, the first arm 14, and the second arm 15 being positioned in the vacuum 11 and about the ROIC 19. A wafer level cap (or cap) 202 is generally positioned over each detector 10 in the array 18 of the RTEG 200' to encapsulate the array 18 of detectors 10. In one example, the cap 202 may be formed of silicon for receiving infrared radiation (IR) to allow the passage of wavelengths of IR from approximately 3 microns to 14 microns. In another example, the cap 202 may be formed of quartz for receiving energy from a solar source such as the sun. The cap 202 is generally formed at the wafer level and may be 0.5 mm thick.

A cavity 204 is formed (or etched) into the ROIC 19 such that the absorber 12 and the arms 14, 15 are suspended about the ROIC 19. The thickness of the cavity 204 may be 5 μm (e.g., from bottom portion of absorber 12 to a top portion of the ROIC 19). By placing the absorber 12, the first arm 14, and the second arm 15 within the cavity 204, a high packing factor may be achieved which corresponds to an increased number of detectors 10 that may be packaged within the array 18.

An enclosing portion 206 is deposited on the ROIC 18 for receiving and bonding the cap 202 to the ROIC 19. A vacuum seal is formed for the absorber 12 when the cap 202 is bonded to the ROIC 18 via the enclosing portion 206. The vacuum 11 formed with the placement of the cap 202 prevents air from coming into contact with the absorber 12 and the arms 14, 15 to ensure that the thermal energy as radiated through the cap 202 and onto the absorber 12 and the arms 14, 15 do no undergo a temperature change due to the presence of the air.

The enclosing portion 206 is generally formed of gold. The gold of the enclosing portion 206 forms a eutectic bond with the silicon of the ROIC 19. An overall thickness of the enclosing portions 206 may be 8 μm. In addition, an overall thickness of the ROIC 19 may be 325 μm. A height between the absorber 12 and a bottom of the cap 202 is 20 μm. The cavity 204 may have a thickness of 5 μm.

As noted above, the absorber 12 and/or the arms 14, 15 enable an increase in thermal resistance and an increase in electrical conduction due to the presence of the superlattice quantum well materials which increase overall performance if implemented in an imaging application (e.g., camera) and for energy storage/generation applications (e.g., RTEG 200 or 200'). Such conditions enable the RTEG to generate electrical power for storage on the storage device 201 or for powering another device 203. The another device 203 may be powered at a later point in time from the storage device 201. The storage device 201 may be one or more batteries or a supercapacitor.

Solar Energy Conversion

The conversion of sunlight into electricity has been dominated by photovoltaic (PV) and solar thermal power generation. PV cells are deployed widely, mostly as flat panels, whereas solar thermal electricity generation relying on optical concentrators and mechanical heat engines may be seen at large-scale power plants. Current commercial PV solar panel conversion efficiencies are 15-17% under AM 1.5 G (1 kW/m$^2$). In one example, a Si/SiGe quantum well RTEG 200 or 200' (hereafter "200") under AM 1.5 G may have an efficiency of 24%. Using a modest solar concentrator, the equivalent of three suns, 3 kW/m$^2$, can be directed onto the RTEG 200 which could yield an efficiency of 35% which may provide nearly a two-fold increase over current commercially available PV technology. Using high solar concentration, the equivalent of five hundred suns, 500 kW/m$^2$, can be directed onto the RTEG which could yield an efficiency of 60% which may exceed current commercially available multi junction Concentrating Photovoltaic (CPV) technology. For solar conversion operation, the top of the absorber 12 may have a high emissivity for wavelengths less than 2 microns and a low emissivity for wavelengths greater than 2 microns to about 25 microns.

Figure 8:
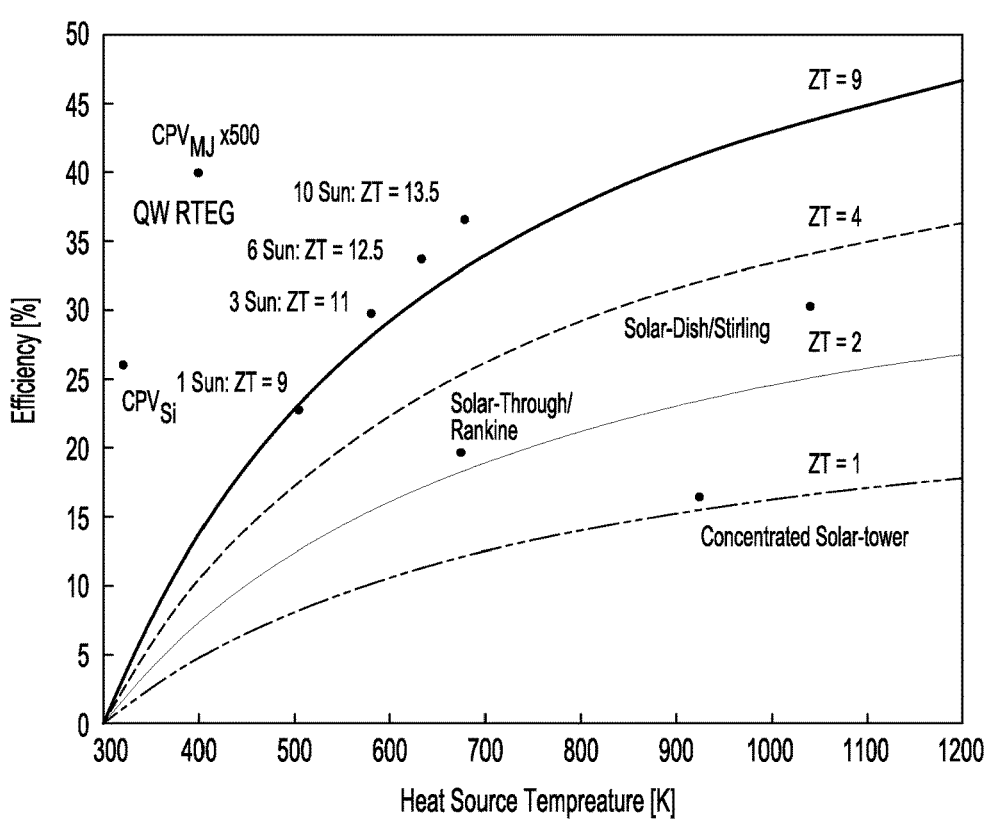
FIG. 8 depicts a spectral distribution of a sun and various hot targets through 5 meters of atmosphere.

FIG. 8 depicts various values of ZT (Z times (absolute temperature of the absorber 12+absolute temperature of the substrate 16) divided by 2) and corresponding efficiencies an ideal thermoelectric can achieve. A point of interest in FIG. 8 is that for very high ZT values, high efficiency can be accomplished at lower temperatures. FIG. 8 depicts the manner in which the RTEG 200, which incorporates the aspects, set forth herein, compares to existing solar electrical generation technologies. As established, very high ZT values may be possible and efficient electrical generation may be provided at lower temperature differences.

The wafer level cap (e.g., cap 202) to achieve an encapsulated environment may be an anti-reflective coated quartz or sapphire to allow the passage of wavelengths from approximately 0.2 microns to 2 microns for the RTEG 200.

Electrical Generation from Hot Objects

Figure 9:
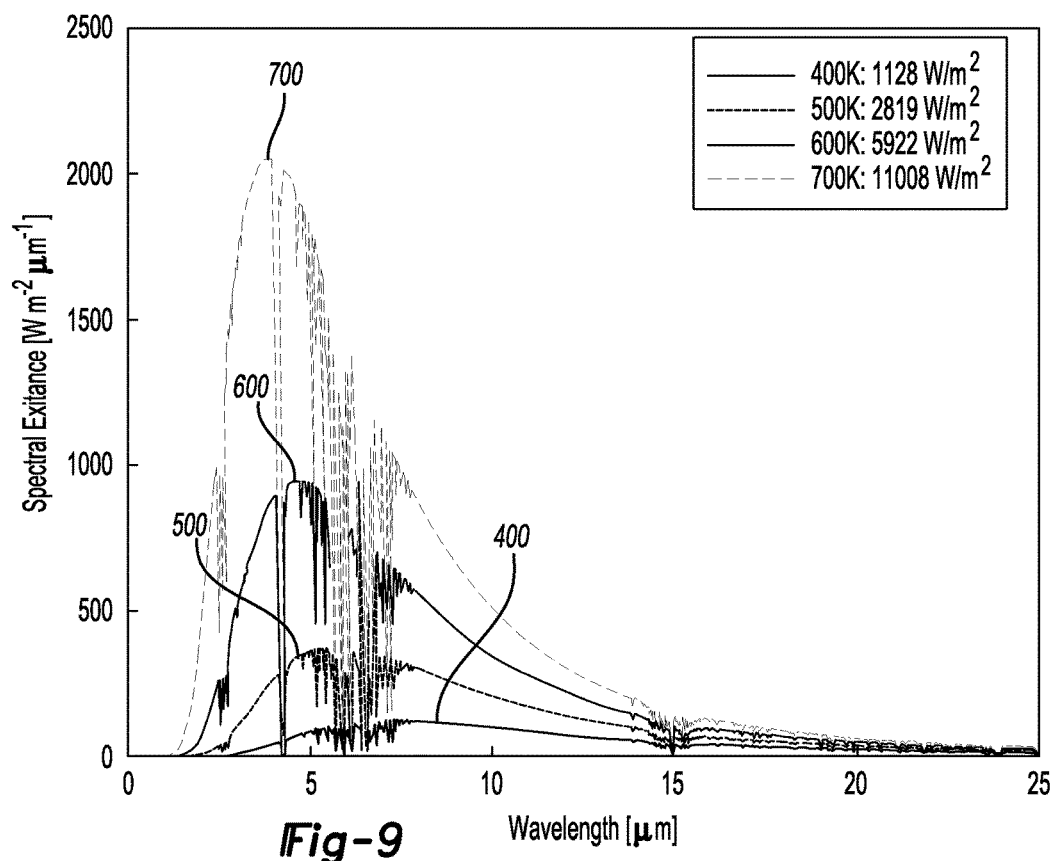
FIG. 9 depicts a spectral excitance of various hot targets through 5 meters of atmosphere.
Figure 10:
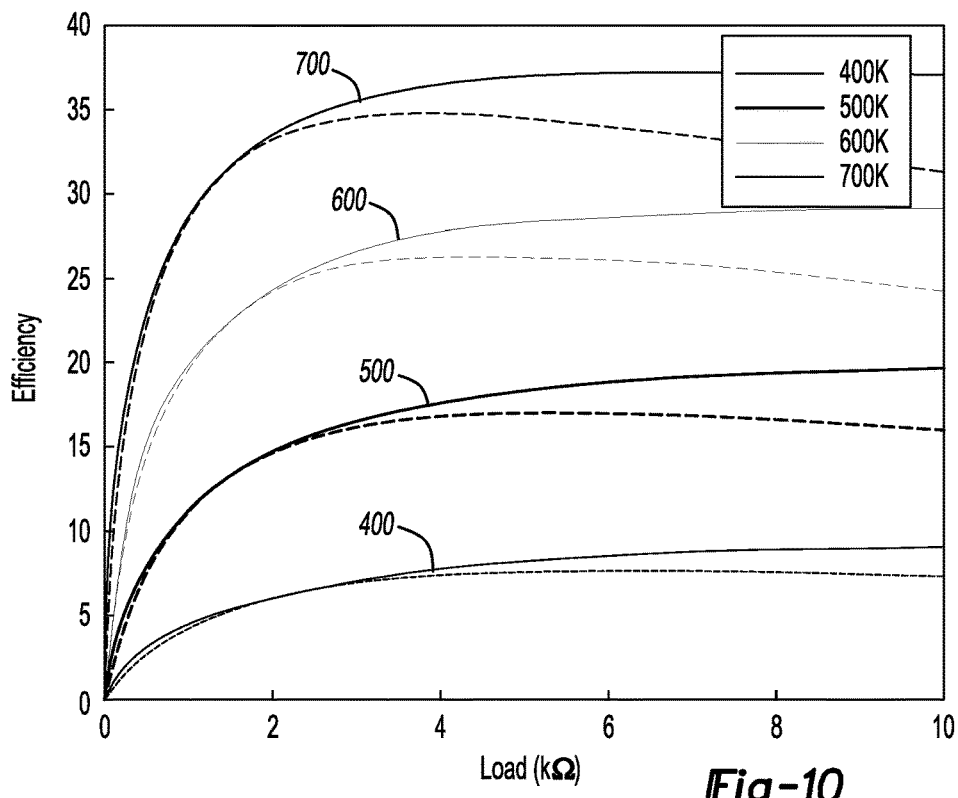
FIG. 10 depicts results from a simulation using parameters from Table 2 for an output from the RTEG.

FIG. 9 depicts a spectral excitance of various hot targets through 5 meters of atmosphere. Note, that a hot object that is slightly above the temperature of boiling water (400K) may produce approximately the energy density from the sun that the earth intercepts. FIG. 10 depicts results from a simulation using the parameters from Table 2 (see above) for the Si/SiGe QW system. This illustrates that high electrical conversion efficiencies may be obtained and that the efficiency may be proportional to the temperature difference as expected for a heat engine. A top portion of the absorber 16 may have a high emissivity for wavelengths at roughly 5 to 14 microns. The wafer level cap (e.g., 202) to achieve an encapsulated environment should be anti-reflective coated silicon to allow the passage of wavelengths from approximately 2 microns to 12 microns for IR radiation electrical conversion.

Day/Night Time Electrical Generation Using Radiative Cooling

Figure 11:
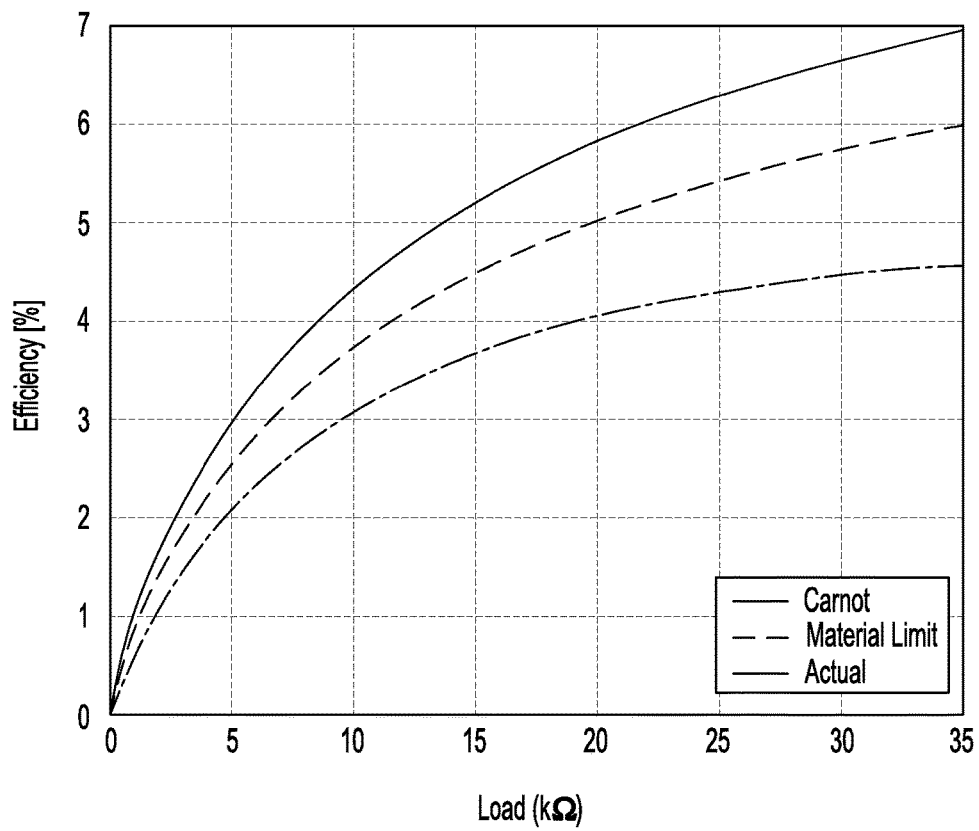
FIG. 11 depicts a computer simulation of the electrical efficiency vs. the load for typical nighttime conditions for the RTEG.

Outdoor radiative cooling under clear sky conditions generally occurs because the atmospheric emittance is low in a wavelength interval of 8-13 microns particularly if the air is dry. One factor in obtaining this cooling in infrared is by using a selective absorber 12 with a low reflectance in the 8-13 micron "window", but with a high reflectance elsewhere. Considering only radiation balance, the cooling power at near ambient temperatures may be approximately 100 W/m$^2$. A Si/SiGe superlattice quantum well RTEG 200 expected efficiency may be approximately 2% under these conditions thereby providing approximately 2 W/m$^2$ of electrical power generation at night under a cold sky. Depending on climatic conditions, daytime operation may allow for heating of the RTEG 200 due to solar insulation, raising the temperature difference, and therefore increasing the output power. Desert conditions are optimal for this approach to electrical generation. FIG. 11 depicts a computer simulation of the electrical output vs. the load for typical nighttime desert conditions.

Applications may include, but not limited to, (a) continuous powering of low power devices (hundreds of milliwatts) with small RTEG 200 panels; and/or (b) larger panels that can be used to run low power equipment and/or charge batteries 201 at night.

In one example, the wafer level cap 202 to achieve an encapsulated environment may be an anti-reflective coated silicon to allow the passage of wavelengths from approximately 2 microns to 12 microns. It is recognized that the cap 200 may be tailored to different wavelengths by changing the type of material used on the cap 202 and also based on absorber 12 characteristics.

It recognized that the detectors as disclosed herein and used in connection with the RTEG 200 and TEG 300 may be constructed in the manner as set forth in International Application No. PCT/US2011/055220 ("the '220 application"), entitled "SUPERLATTICE QUANTUM WELL INFRARED DETECTOR" filed on Apr. 19, 2012.

TEG

A Si/SiGe quantum well standard TEG is capable of reaching the electrical conversion efficiencies that have been predicted herein. One challenge may be to obtain satisfactory quantum well (QW) films on substrates that have a low thermal conductivity. The substrate material used may have to take into account a parasitic heat leak that has to be minimized. Also, the substrate material that is selected may be the platform for which the films are deposited. For both the power generation and cooling applications, performance may be limited due to substrate thermal losses. QW materials may have the best measured power factor and combined with low thermal conductivity substrates, may provide high TEG modules.

In order to reach the levels of efficiency that the QW materials may obtain, radiative and conductive losses in the TEG 300 should be minimized. One approach that may minimize such losses and allow for the use of the QW effect (see FIG. 4A) may be to use cantilever arms as disclosed below.

Figure 12:
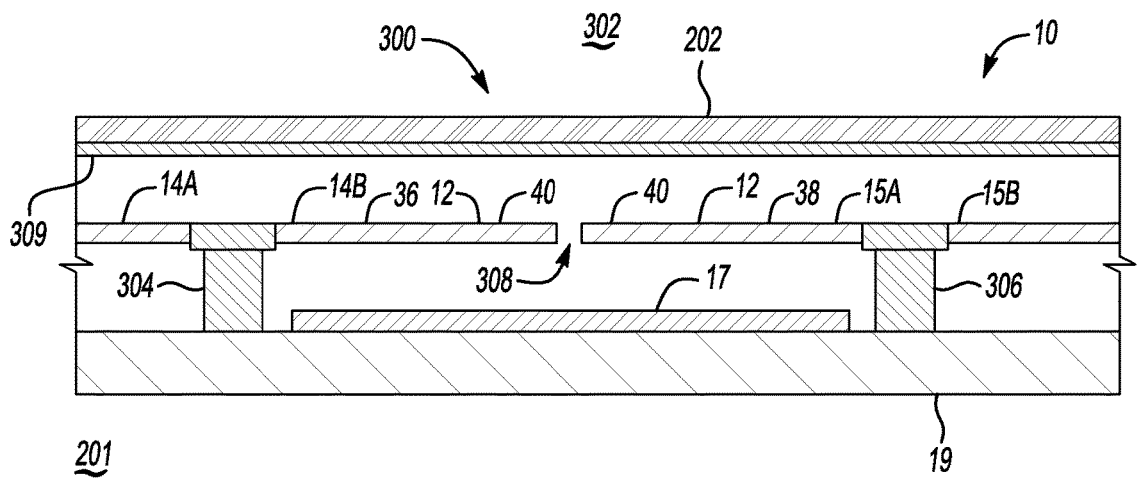
FIG. 12 depicts a side view a TEG using cantilever arms in an unconnected state to a cap in one embodiment.

FIG. 12 depicts a side view a detector in the TEG 300 using cantilever arms in an unconnected state to the cap 202 in one embodiment. In general, the TEG 300 includes a portion thereof that is coupled to a heat generating source 302 to receive thermal energy for generating electrical energy in response to the thermal energy for powering another device 201 and/or for storing electrical energy on the storage device 203 such as a battery.

The TEG 300 generally includes a plurality of detectors 10 that are arranged in the array 18. Each detector 10 includes first arms 14a-14b (e.g., cantilevered arms), second arms 15a-15b (e.g., cantilevered arms), a first post 304, a second post 306, and the absorber 12. As noted above, the absorber 12 includes the first portion 36, the second portion 38, and an active region 40. The first arms 14a-14b and/or the first portion 36 may be constructed from P-type materials. The second arms 15a-15n and the second portion 38 may be constructed from N-type materials. The active region 40 electrically couples the P-type based elements (first arm 14b and the first portion 36) to the N-type based elements (second arm 15a and the second portion 38). It is recognized however that in some embodiments, the absorber 12 may not include either P-type or N-type materials and may simply comprise the active region 40. In other words, the amount of P-type and N-type materials on the absorber 12 may vary based on the desired criteria of a particular implementation.

The first post 304 is generally configured to support the first arms 14a-14b, and one side of the absorber 12 above the ROIC 16. The second post 306 is generally configured to support the second arms 14a-14b and another side of the absorber 12 above the ROIC 19. Each of the first post 304 and the second post 306 enable electrical conduction from the first arms 14a-14b and the second arms 15a-15b, respectively to the ROIC 19. A height of the first post 304 and the second post 306 is between 2 μm-10 μm.

The reflector 17 is positioned below the first arm 14b and the second arm 15b. The reflector 17 may enhance the ability for the absorber 12 to absorb thermal energy. The reflector 17 may be formed of aluminum or palladium. The reflector 17 may reflect thermal energy not absorbed (e.g., unused thermal energy) by the absorber 12 back to the absorber 12. The reflector 17 may also reflect the thermal energy back to the first arms 14a-14n and to the second arms 15a-15b. The palladium based reflector 17 may also function as a getter in the event the TEG 300 is implemented in a vacuum.

The cap 202 is generally positioned over the absorber 12, the first arms 14a-14b, the second arms 15a-15b, the posts 304 and 306, the reflector 17 and the ROIC 19. The cap 202 may be formed of silicon and is a metalized surface. The cap 202 includes a coupling layer 309 (or a layer of gold (or alternatively aluminum) 309 (however gold is preferable)) deposited on a bottom portion thereof. The relevance of the coupling layer 309 will be discussed in more detail below. The cap 202 may be a highly thermal conductive material. In general, the cap 202 is arranged to contact the heat generating device 302. This aspect will be described in more detail below.

Figure 13:
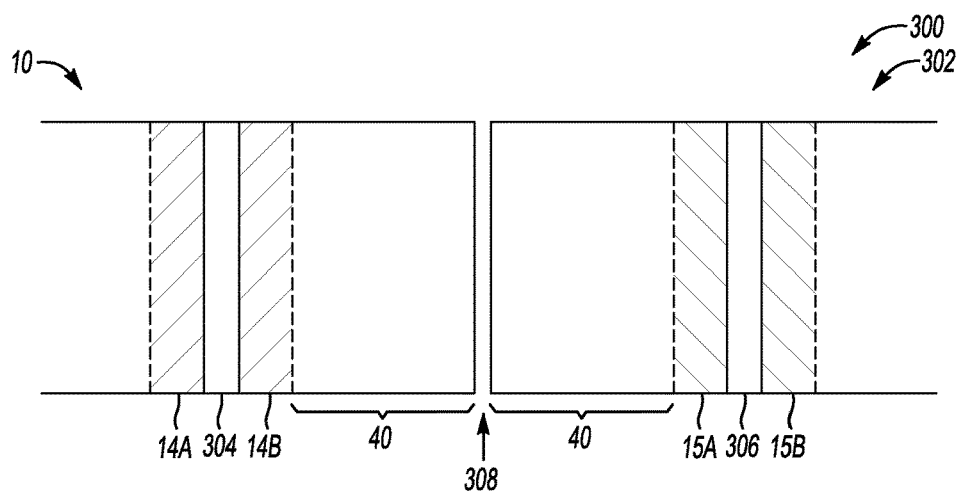
FIG. 13 depicts a top view of the cantilever arms of the TEG in one embodiment.

FIG. 13 depicts a top view of aspects of the detector 10 for the TEG 300 of FIG. 12. For example, the active region 40 of the absorber 12 is generally formed of aluminum or preferably gold. The gold of the active region 40 covers a layer of silicon nitride. While in some cases the absorber 12 does not include superlattice quantum well materials, the gold of the active region 40 may still be deposited on a layer of silicon nitride since the layer of silicon nitride is also used as a base. A gap 308 is formed between the active region 40 of the absorber 12. As shown, the absorber 12 does not include any of the superlattice quantum well materials and comprises the gold covered layer of silicon nitride. Each of the first arms 14a-14b and the second arms 15a-15b includes the superlattice quantum well materials. Each of the first arms 14a-14b and the second arms 15a-15b may have a total thickness of Si/SiGe of 1000-5000 Å (e.g., 10 to 50 layers at 100 Å). In addition, a width of each the first arms 14a or 14b and the second arms may be 10 μm. A width of each of the active regions 40 as separated by the gap 308 may be 200 μm. A width of the gap 308 may be 1 μm. The overall length of each active region 40 as separated by the gap 308 is 200 μm.

Figure 14:
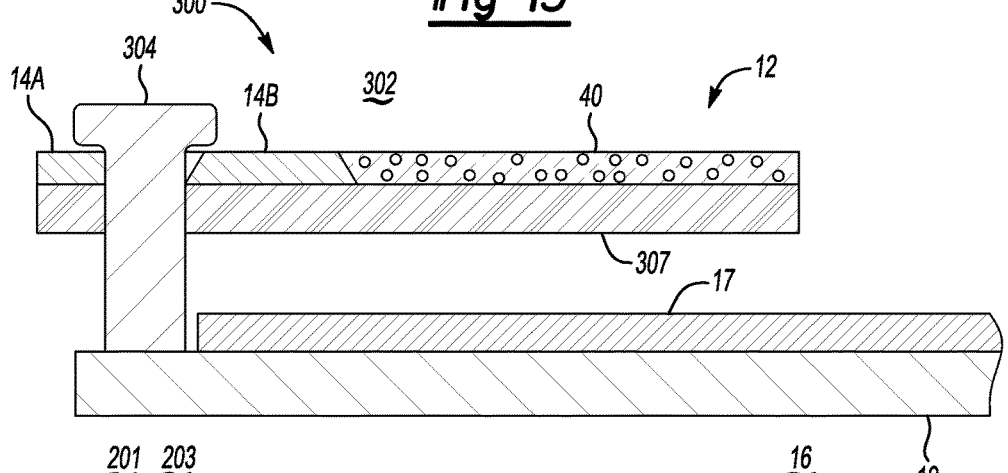
FIG. 14 depicts an enlarged view of the p-type arm which illustrates that it may be made up of a silicon nitride base with the p-type Si/SiGe QW material and a metal film deposited on a top of the silicon nitride for the TEG.

In general, the first arms 15a-15b may be formed of P-type Si/SiGe quantum well materials that is positioned on silicon nitride to stress compensate the P-type superlattice quantum well materials. The second arms 16a-16b may be formed of N-type Si/SiGe quantum well that is positioned on silicon nitride to stress compensate the N-type superlattice quantum well materials FIG. 14 depicts an enlarged view for one side of the detector 10 for the TEG 300 of FIG. 14. As shown, the absorber 12 generally includes the active region 40 which comprises a metal film of gold (or aluminum) and no superlattice quantum well materials. Each of the second arm 14b and the active region 40 is deposited on top of layer of silicon nitride 307. The layer of silicon nitride 307 stress compensates the superlattice quantum well P-type layers and supports the same over the ROIC 19 (and substrate 16). It is recognized that additional implementations may include the absorber 12 including superlattice quantum well materials.

Figure 15:
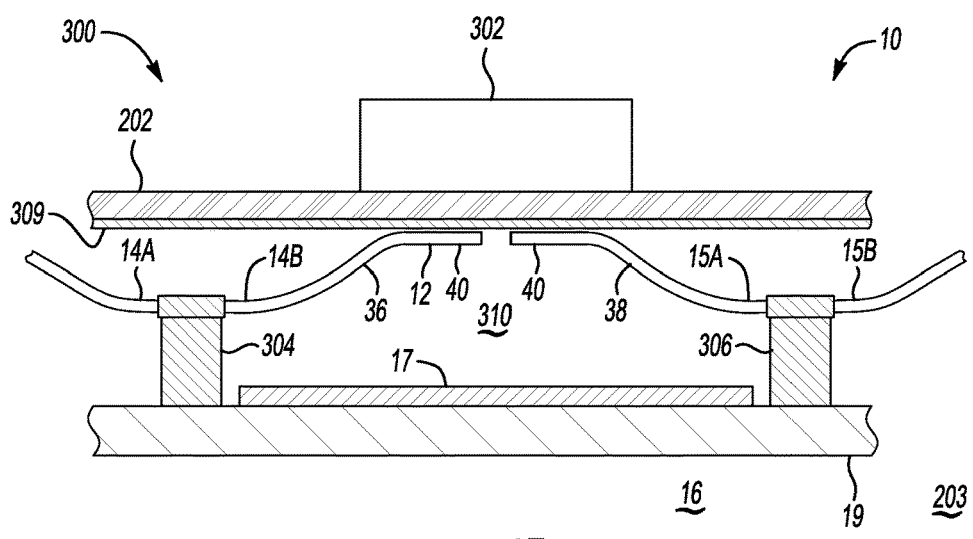
FIG. 15 depicts a side view in which both arms of the detector for the TEG are raised to contact a silicon cap.

FIG. 15 depicts a side view of aspects of the detector 10 for the TEG 300 of FIG. 12 in which the absorber 12 (e.g., active region 40 or metal film) is raised to contact the cap 202. For example, the active region 40 of the absorber 12 may be electrostatically raised to contact the cap 202. The gold as deposited on the active region 40 may contact the layer of gold 309 of the cap 202 (e.g., the coupling layer 309 couples the active region 40 to the cap 202). In general, the silicon properties of the cap 202 when diffused with the gold (e.g., layer of gold 309) and the gold deposited on the active region 40 results in a lower molting point. Eutectic bonding is based on the ability of silicon (Si) to alloy with numerous metals and forms a eutectic system. Established eutectic formations generally include Si with gold or with aluminum. The melting point for the gold/silicon eutectic is 370 C, much lower than a melting point of the individual materials and much lower than the aluminum/silicon eutectic (580 C).

While not shown, the cap 202 is attached to the substrate 16. After the cap 202 is attached to the substrate 16, the active region 40 is attached to the cap 202. An inside chamber 310 is formed to provide a vacuum when the cap 202 is attached to the substrate 16 and when the active region 40 is attached to the cap 202. To accomplish the attachment of the absorber 12 (e.g., active region 40), a voltage is applied to the cap 202 and to the substrate 16 (or TEG electrical connections). In one example, the voltage polarity may be positive for the cap 202 and negative for the substrate/TEG 300 electrical connections. As the voltage increases, the absorber 12 may be drawn upwards to the cap 202. When the absorber 12 reaches the cap 202, the absorber 12 may be attached to the cap 202 by, for example, a $CO_2$ laser.

As noted above, the cap 202 may be coupled to the heat generating source 302. The heat generating source 302 delivers thermal energy to the cap 202. The cap 202 conducts the thermal energy to the absorber 12 (or the metal film of the active region 40) that is contact with the cap 202. In turn, the thermal energy is delivered to superlattice quantum materials of the arms 14a-14b and 15a-15b which generates current (or power). Such current is passed through the posts 304 and the ROIC 19, and then stored on the storage device 203 or provided to another device 201 for powering the same. Having the cap 202 attached to the absorber 12 may provide for a larger amount of heat transfer to the quantum well material which may provide for a larger amount of electrical generation.

As noted above, the presence of the superlattice quantum wells on the arms 14a-14b and 15a-15b (and also on the absorber 12 if implemented to include such materials) may enable an increase in thermal resistance and an increase in electrical conduction which also increases overall performance of the TEG 300. Another advantage may be the efficient utilization of cap area (up to 70%) 202 in transferring heat to the TEG which may increase TEG efficiency. Moreover, attaching the cap 202 to the active region 40 may allow for the heat to flow along the quantum well layers which may be necessary to achieve the desired quantum well effect in the superlattice quantum well materials.

It is recognized that the TEG 300 may be coupled to any number of heat generating sources 202 such as, but not limited to, a muffler (or engine) for automotive applications in which it is desirable to harvest energy or a hot water pipe (or furnace) for powering various devices in a residential and/or commercial establishment.

Figure 16:
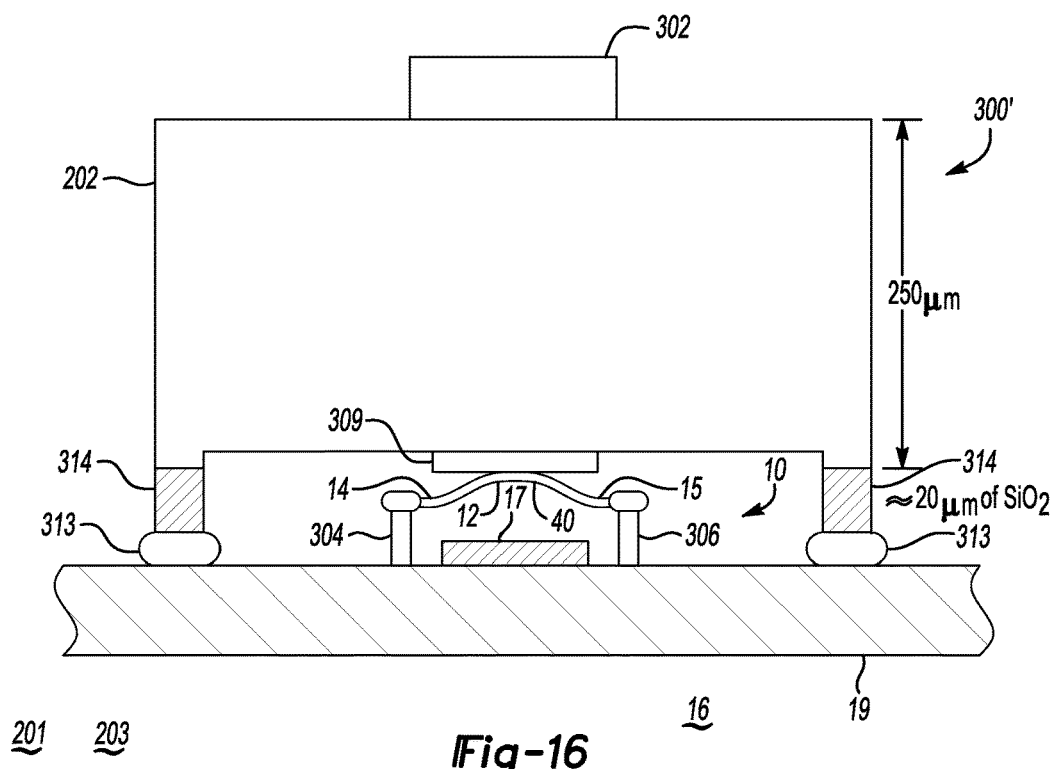
FIG. 16 depicts placement of a layer of $SiO_2$ on the silicon cap.

FIG. 16 depicts another side view of aspects of the detector 10 for another TEG 300' in accordance to one embodiment. The detector 10 for the TEG 300' generally includes the absorber 12, the first arm 14, the second arm 15, the first post 304, and the second post 306. The absorber 12 is raised to contact the gold layer 309 of the cap 202. The absorber 12 may have a portion thereof that includes the superlattice quantum well materials. The absorber 12 also includes the active region 40 in which a layer of silicon nitride is covered by gold. The active region 40 contacts the gold layer 309 of the cap 202.

The cap 202 is coupled to the heat generating source 302. The heat generating source 302 delivers thermal energy to the cap 202. The cap 202 conducts the thermal energy to the layer of gold 309 which in turn conducts the thermal energy to the active region 40 and to the superlattice quantum materials that form absorber 12, the first arm 14, and the second arm 15. The thermal energy is converted into electrical energy via the superlattice quantum materials of the first arm 14, the second arm 15, and the absorber 12 and current (or power) passes through the posts 304, 306 to the ROIC 19. The current may be stored on the storage device 203 or provided to the device 201 for powering the same.

An insulation layer 314 is applied to the cap 202. In one example, the insulation layer 314 may be silicon dioxide (or $SiO_2$). A layer of solder 313 is applied between the insulation layer 314 and the ROIC 16 to form a hermetic seal (e.g., create a vacuum for the detector 10 to lie within). The insulation layer 314 operates to minimize heat transfer to the ROIC 19.

Figure 17:
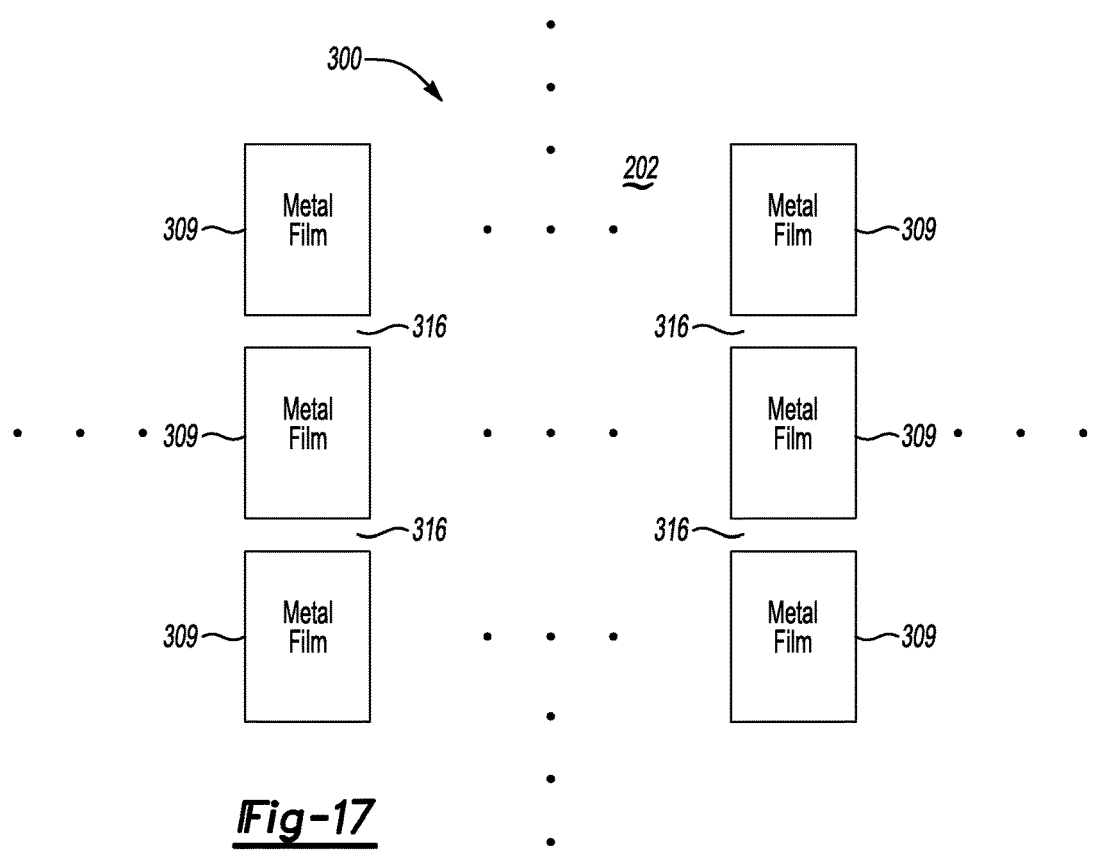
FIG. 17 depicts an example of a metallization pattern that may be applied to the bottom of the silicon cap.

FIG. 17 depicts an example metallization pattern 320 (e.g. pattern of layers of gold 309) that may be applied to a bottom of the cap 202 for the TEG 300 (or 300' (collectively 300 hereafter)). For example, the metallization pattern 320 generally comprises a plurality of layers of gold 309. Each layer of gold 309 as illustrated may be associated with a respective detector 10. A gap 316 is formed between each layer of gold 309 to electrically isolate each detector 10 from one another. Each layer of gold 309 is arranged to contact absorber 12 and/or the first and second arms 14, 15. In addition, each layer of gold 309 may also have an electrical resistivity ρ of 0.01 to 0.1. It is recognized the cap 202 (e.g., silicon cap) may have a high resistivity of ρ≥1 ohm/cm.

Figure 18:
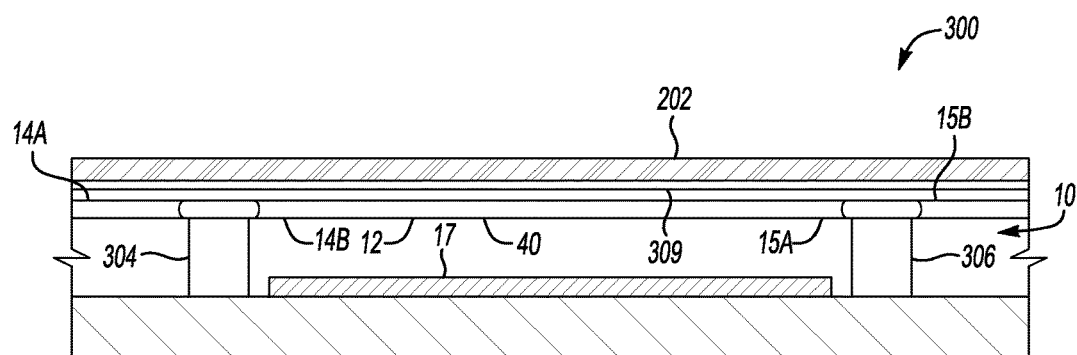
FIG. 18 depicts another approach in which the absorber may be attached to the cap.

FIG. 18 depicts a side view of aspects of the detector 10 for another TEG 300 in accordance with one embodiment. As shown, the detector 10 does not include the gap 308 to separate the absorber 12 into a plurality of active regions 40. This condition enables a distance between the bottom of the cap 202 (or at the bottom of the layer of gold 309) and a top of the suspended membrane (e.g., the first arms 14a-14b, the second arms 15a-15b, and the absorber 12) to be relatively smaller when compared to the distance between the foregoing elements as shown in FIGS. 12 and 15. The absorber 12 may be a flexible one piece absorber that may rise up electrostatically to attach the cap 202.

Figure 19:
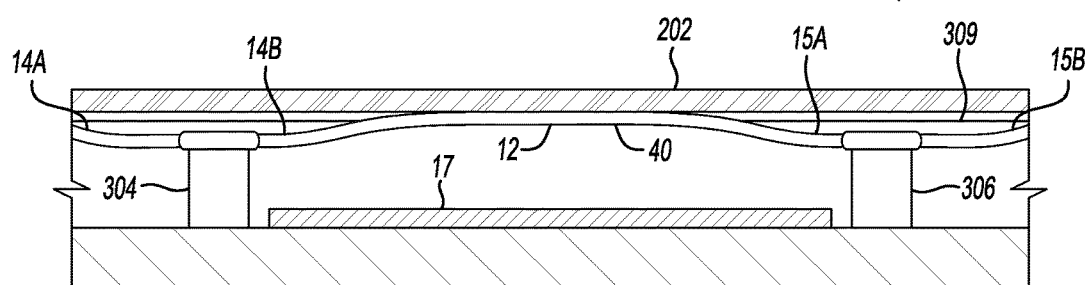
FIG. 19 depicts a side view of the detector of the TEG after attachment.
Figure 22:
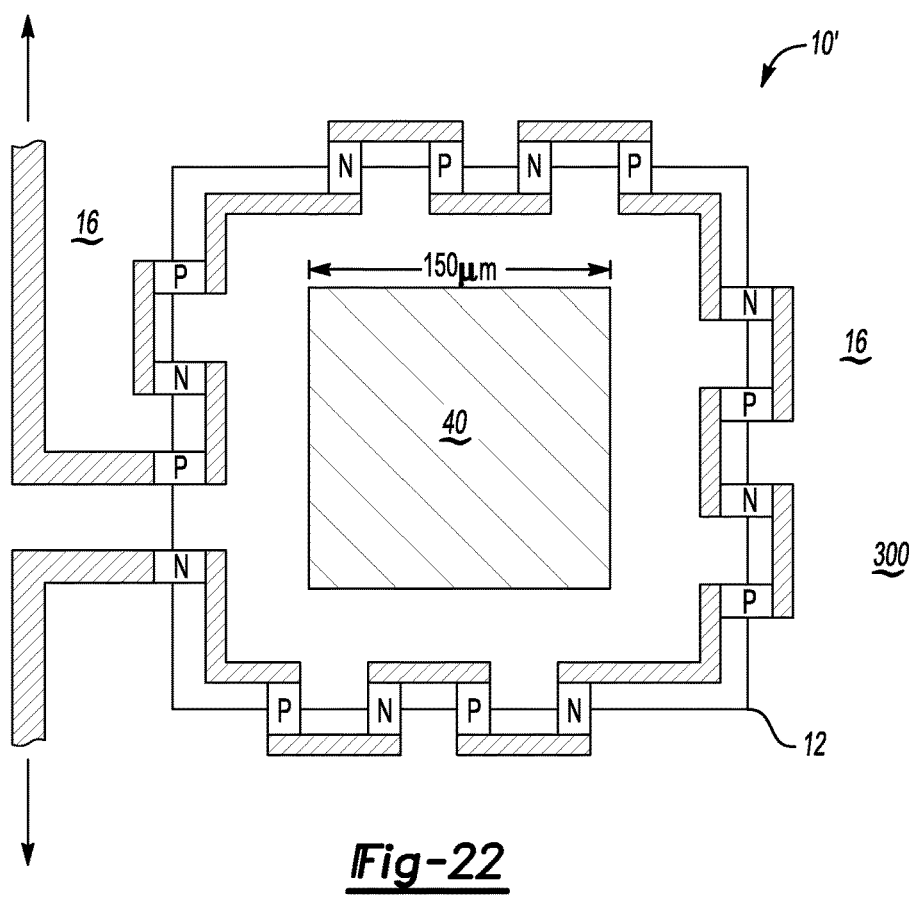
FIG. 22 depicts a top view of the TEG including the thermal detector as set forth in FIG. 2 with the cap being attached.

FIG. 19 depicts a side view of the detector for the TEG 300 as illustrated in FIG. 22 when the absorber 12 is raised to contact the cap 202. As noted above, the gap 308 is not present in this implementation resulting in less distance for the absorber 12 to travel in order to contact the cap 202. This condition may provide more contact surface between the absorber 12 and the cap 202 which enables more thermal transfer to the absorber 12 thereby resulting in more electrical energy.

Figure 20:
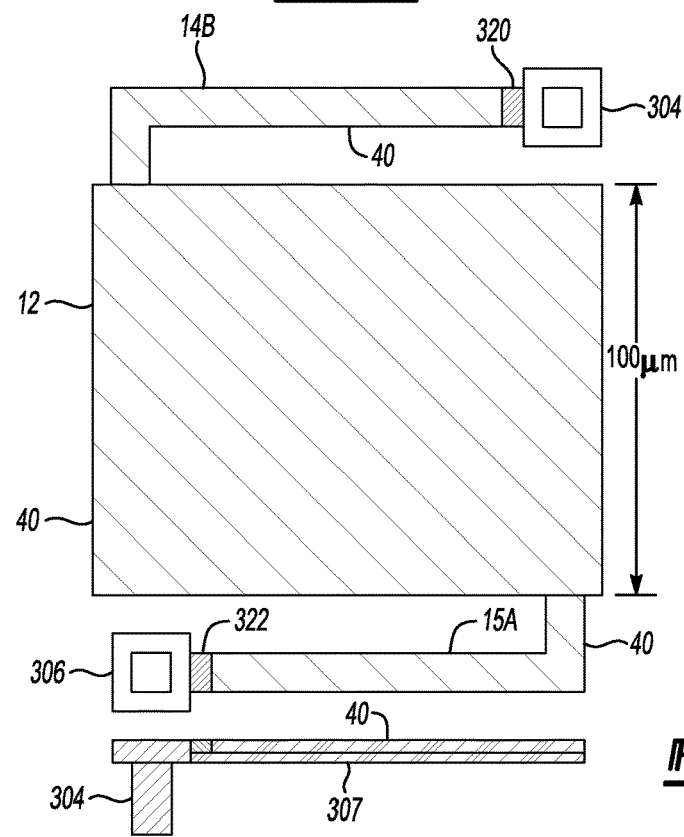
FIG. 20 depicts a top view of another detector design that may be pulled up electrostatically to the cap for attachment.

FIG. 20 depicts a top view of another detector 10 in connection with the TEG 300 in accordance to one embodiment. The absorber 12 includes a layer of aluminum or gold (e.g., thickness of 2 µm) which covers the layer of silicon nitride 307 (e.g., thickness of 2 µm) positioned below the active region 40. The absorber 12 is electrostatically raised for attachment to the cap 202. The first arm 14b and the second arm 15a are generally flexible to enable the absorber 12 to be pulled up to touch the cap 202 when a proper voltage is applied between the detector 10 and the cap 202. The first arm 14b and the second arm 15a may comprise the active region 40 in addition to the layer of aluminum or gold that covers the layer of silicon nitride 307.

A first portion 320 on the first arm 14 may include P-type superlattice quantum well materials. A second portion 322 on the second arm 15a may include N-type superlattice quantum well materials. As shown, dimensions of the second portion 322 of superlattice quantum well materials are 5 µm in length and 1γm thick. An overall thickness of the layer of aluminum or gold and the layer of silicon nitride 307 is approximately 2 µm. The thickness of the layer of silicon nitride 307 may be between 0.5 µm and 1 µm. In general, a length of the first arm 14b and the second arm 15a may be 130 µm.

Figure 21:
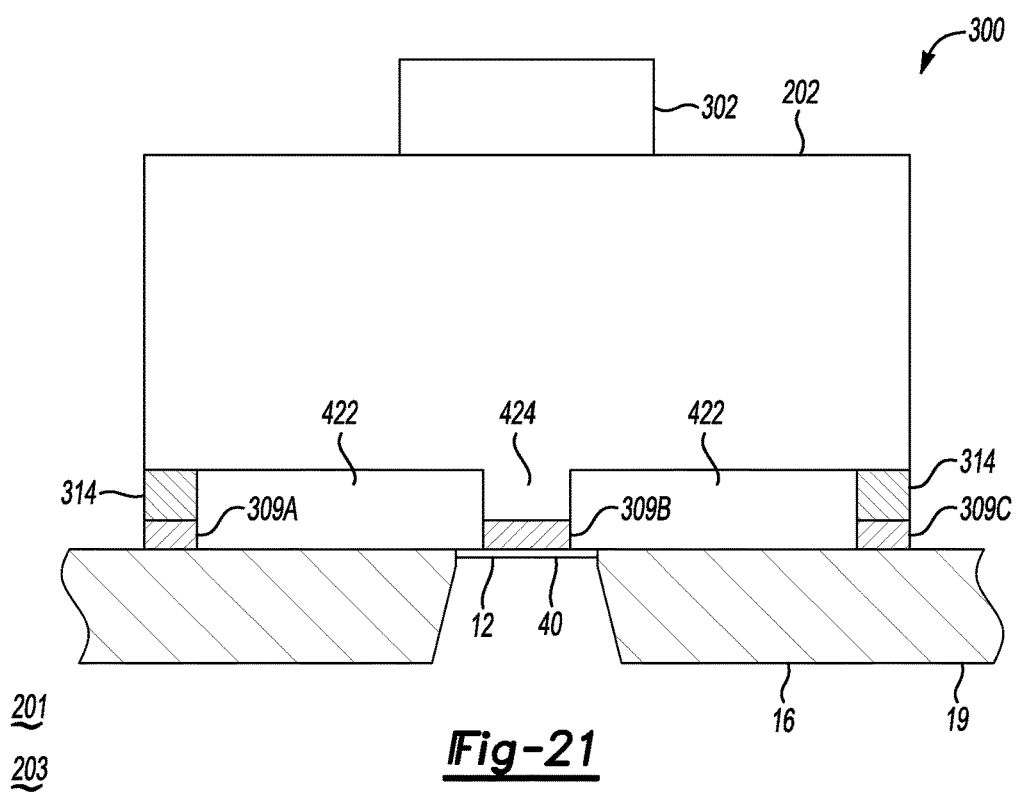
FIG. 21 depicts another TEG implementation including a thermal shunting arrangement in accordance to one embodiment.

FIG. 21 depicts a side view of aspects of the detector 10' (see FIG. 2) for another TEG 300 in accordance to one embodiment. As shown, the detector 10' includes the absorber 12 and the active region 40. Of note, the detector 10' does not include the first arm 14 and the second arm 15. A portion of the absorber 12 includes p-type superlattice quantum well materials and n-type superlattice quantum well materials. Remaining portions of the absorber 12 include the active region 40 which includes the layer of gold (or aluminum). As shown, the active region 40 that includes the layer of gold (or aluminum) is coupled the layer of gold (or aluminum) 309b of the silicon cap 202. This may provide for an easier bonding operation in that there is no silicon dioxide to act as a thermal insulator. The remaining layers of gold 309a and 309c are coupled directly to the ROIC 19 (or substrate 16). The ROIC 19 is generally embedded within the substrate 16. For example, electronics positioned within the substrate 16 forms the ROIC 19. A thickness of the layers of gold (or aluminum) 309a-309c is approximately 1 µm. The insulation layer 314 is positioned between the cap 202 and the layer of gold 309a and between the cap 202 and the layer of gold 309c. As noted above, the insulation layer 314 may include silicon dioxide (or $SiO_2$) such as glass (e.g., spin-on glass) or other suitable material. The insulation layer 314 is generally arranged to prevent the transfer of thermal energy through the layers of gold 309a and 309c and through the substrate 16. Specifically, this condition minimizes thermal shunting between portions of the cap 202 that are mechanically coupled to portions of the substrate 16 except for the mechanical connection with the absorber 12. The insulation layer 314 enables a condensed amount of thermal energy to flow through the layer of gold 309b and the absorber 12 (or the active region 40). This condition increases the electrical output of TEG 300. The insulation layer 314 serves to inhibit thermal energy from flowing through to the substrate 16 and enables the condensed amount of thermal energy to flow to the absorber 12 to increase the electrical output. It is recognized that the cap 202 is generally rectangular in shape. The insulation layer 314 is generally shaped in the form of a rectangular ring for receiving the cap 202. In addition, the layers of gold 309a and 309c form a rectangular ring on the substrate 16 for receiving the insulation layer 314.

FIG. 21 also depicts or illustrates an extending portion 424 that extends from the cap 202. The relevance of this will be discussed below in connection with FIG. 27. As illustrated in FIG. 21, the insulation layer 314 is substantially co-planar with the extending portion 424 of the cap 202. This is further illustrated in connection with FIGS. 23 and 27. The cap 202 defines (or forms) cavities 422 (see also FIG. 27) which separate the extending portion 424 from the insulation layer 314. As shown, the cap 202 is positioned over the substrate 16. In addition, the cap 202 is attached to the substrate 16 via the insulation layer 314 and the coupling layer 309a and 309c (e.g., the gold layers).

FIG. 22 depicts a top view of the detector 10' of the TEG 300 of FIG. 21. The absorber 12 includes first portions of p-type and n-type superlattice quantum well materials positioned thereon. The substrate 16 includes second portions of p-type and n-type superlattice quantum well materials positioned thereon. This condition may be suitable for thermal energy transfer. As shown, the first portions of p-type and n-type superlattice quantum well materials on the absorber 12 are electrically and thermally coupled to the second portions of p-type and n-type superlattice quantum well materials on the ROIC 16 such that an electrical output is provided to a next detector 10' in the array 18. The active region 40 as generally shown may be attached to the cap 202. In this case, the overall thickness of the layers of gold between the active region 40 and the layer of gold 309b on the cap 202 may be 5000 Å. The thickness of the layer of silicon nitride below the active region 40 is 1 to 2 µm. In addition, the overall length of the detector 10' is 200 µm.

While FIG. 22 depicts that the substrate 16 (or ROIC 19) receives (or shares) portions of the superlattice quantum well materials, it is recognized that the substrate 16 may not include the superlattice quantum well materials and may receive the metalized film of the active region 40 instead. This condition may also be suitable for thermal energy transfer or heat transfer.

Figure 23:
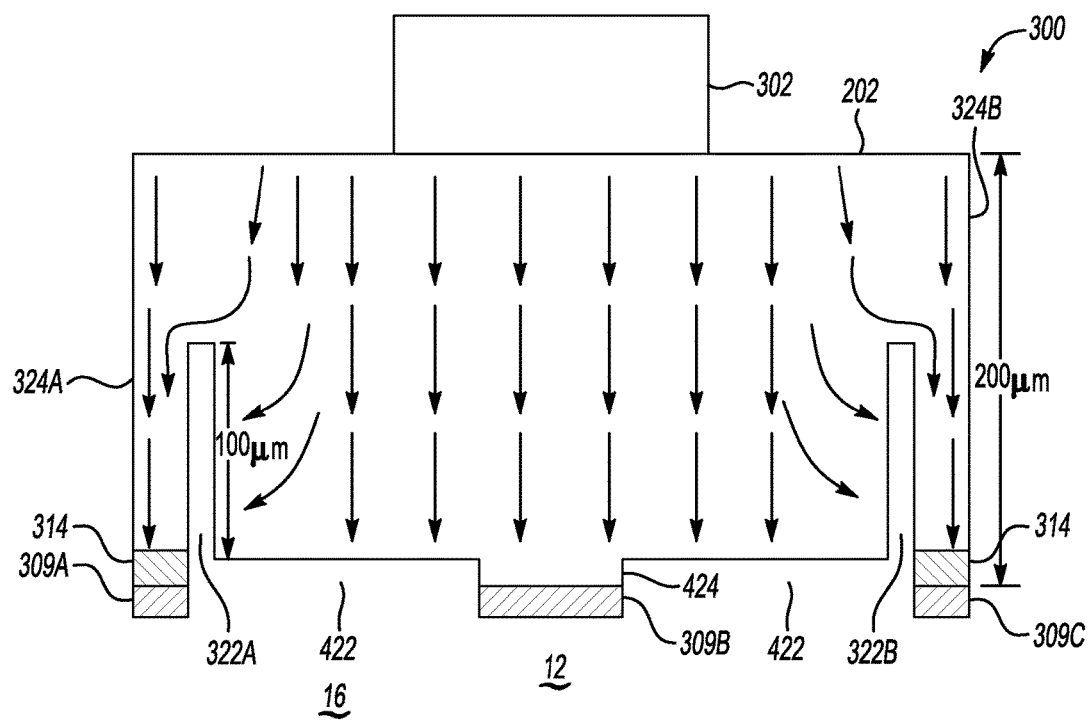
FIG. 23 depicts a thermal shunting arrangement in accordance to one embodiment.

FIG. 23 depicts implementation of the cap 202 in the TEG 300 in accordance to one embodiment. The cap 202 as illustrated in FIG. 23 may be used in connection with the detector 10' of FIG. 21. The cap 202 includes (or defines) a trench 322a, 322b about the layer of gold (or aluminum) 309a, 309c, respectively. A width of each trench 322a, 322b may be approximately 10 µm and a length of each trench 322a, 322b may be 100 µm. The trenches 322a, 322b enable the flow of thermal energy from the heat generating device 302 to flow to the absorber 12 and serves to choke the transfer of thermal energy to the ROIC 16 via the layer of gold 309a, 309c. For example, the thermal resistance at a leg 324a, 324b of the cap 202 is increased thereby causing less heat to flow through the mechanical attachments formed between the layers of gold 309a, 309c at the ROIC 16. The insulation layer 314 may be placed between the cap 202 and the layers of gold 309a and 309c at the legs 324a and 324b. This condition further enables the thermal resistance of the legs 324a and 324b to increase thereby causing less heat to flow through the mechanical attachments formed between the layers of gold 309a and 309c. In addition, this also allows the flow of thermal energy to flow to the absorber 12. FIG. 23 also depicts or illustrates the extending portion 424 of the cap 202. This feature will be discussed below in connection with FIG. 27. As illustrated in FIG. 23, the insulation layer 314 is substantially co-planar with the extending portion 424. This is further illustrated in connection with FIG. 27. The cap 202 defines (or forms) the cavities 422 (see also FIG. 27) which separate the extending portion 424 of the cap 202 from the insulation layer 314.

Figure 24:
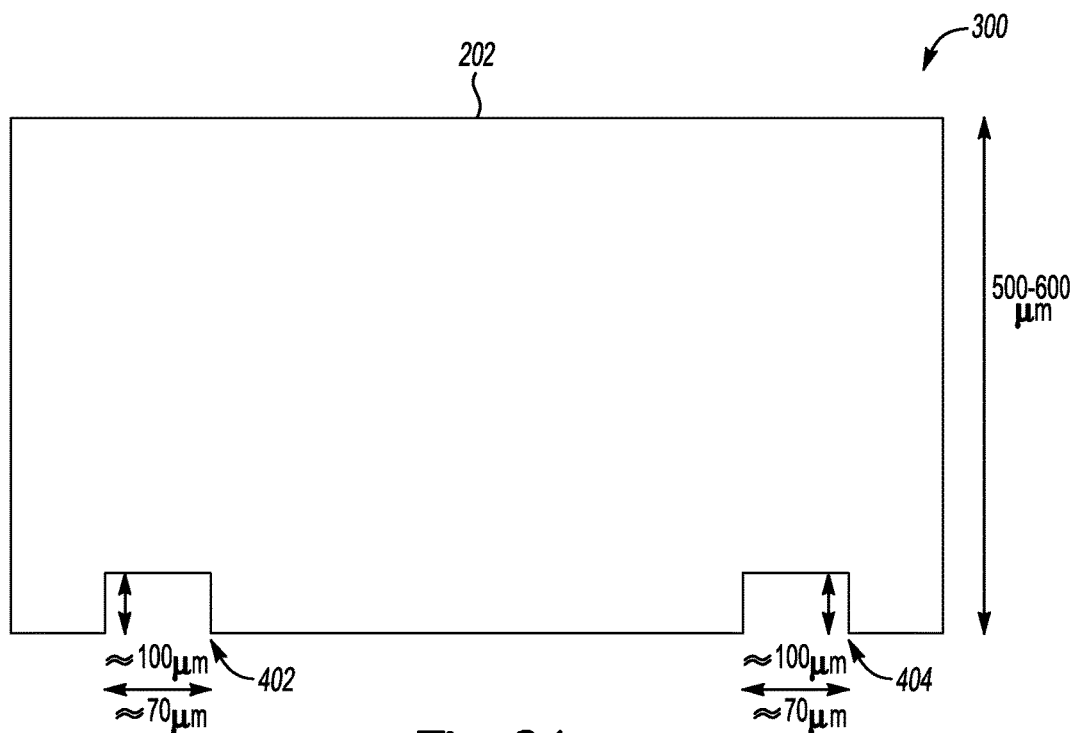
FIGS. 24-28 depict various operations to provide a thermal shunting arrangement.

FIG. 24 depicts a first operation in providing the TEG 300 with minimal thermal shunting. An overall height for the cap 202 may be between, for example, 500 and 600 µm. First and second cavities 402 and 404 are formed in the cap 202 (e.g., silicon cap 202) in response to a dry etching operation. An overall height for each cavity 402 and 404 may be, for example, 100 µm and an overall length for each cavity 402 and 404 may be, for example, 70 µm. It is recognized that other insulator materials may be used instead of glass (e.g., spin on glass) such as, but not limited to, thermal oxides that can be grown into the cavities 402 and 404.

Figure 25:
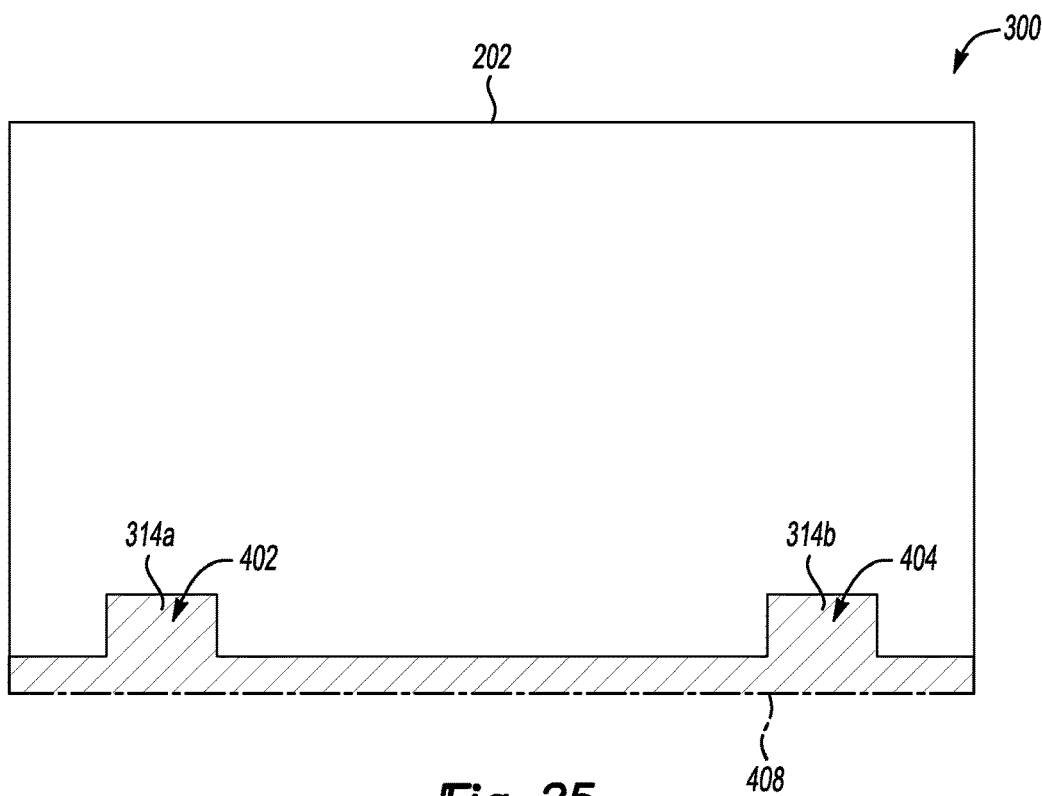

FIG. 25 depicts a second operation in providing the TEG 300 with minimal thermal shunting. The insulation material (or layer) 314 (or 314a, 314b) as noted above, may be, for example, spin-on-glass, or glass (or silicon dioxide), that is deposited and re-flowed such that the cavities 402 and 404 are filled with the insulation layer 314a and 314b, respectively. As shown, the insulation layer 314a, 314b may extend outwardly from the cavities 402 and 404 to form a planar portion 408 of insulation layer.

Figure 26:
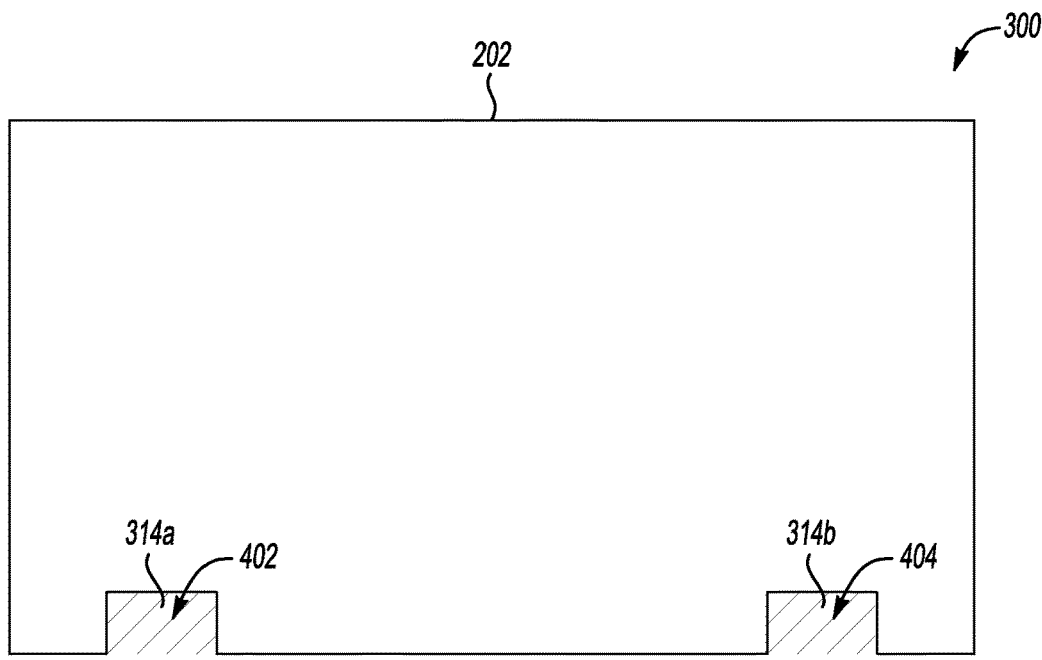

FIG. 26 depicts a third operation in providing the TEG 300 with minimal thermal shunting. A dry etch operation is performed to remove the planar portion 408 until the silicon surface of the cap 202 is reached. It may be preferable to use a gas-mixture that etches the silicon from the cap 302 and the spin-on-glass material (i.e., the insulation layer 314a, 314b) at a similar rate to ensure that the remaining surface after etching remains planar.

Figure 27:
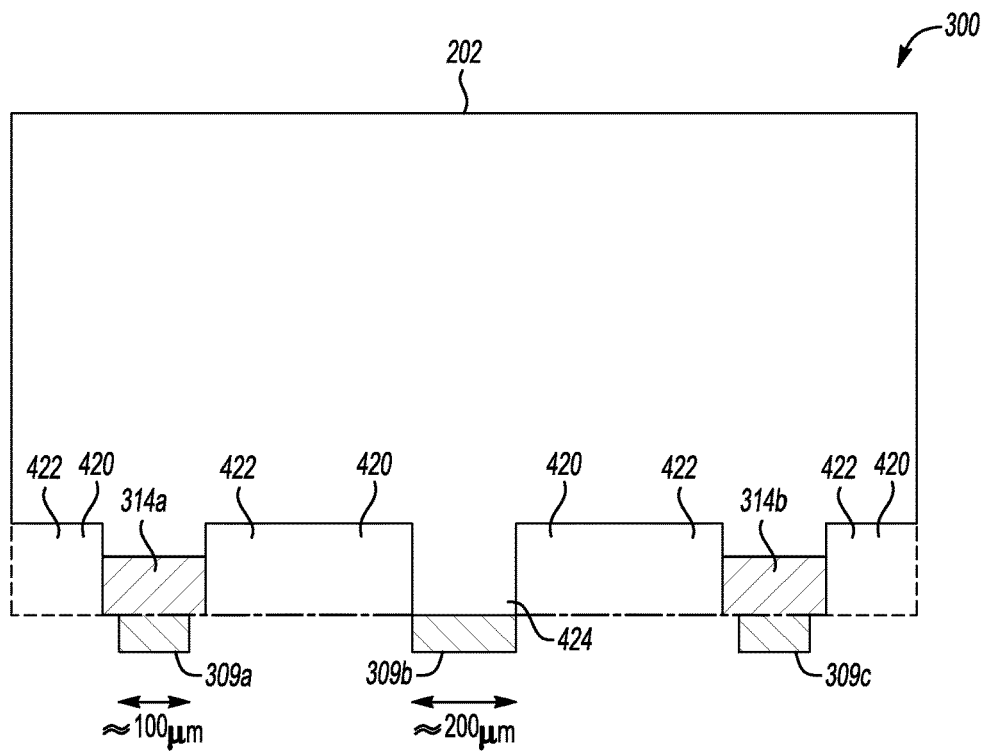

FIG. 27 depicts a fourth operation in providing the TEG 300 with minimal thermal shunting. A dry etch operation is performed to remove portions 420 of the cap 202 to form the cavities 422 about the cap 202. The dry etch operation may be performed with a gas that is selective to etch silicon (e.g., silicon from the cap 202) but will not etch the insulation layer 314a and 314b (e.g., the spin on glass). The extending portion 424 of the cap 202 remains after the dry etch portion is performed. Various gold layers 309a, 309b, and 309c may be deposited on the insulation layer 314a, the extending portion 424 of the cap 202 and on the insulation layer 314b, respectively, prior to dry etch. A thickness of the gold layer 309a and 309c may be 8 µm and a width of the gold layer 309a and 309c may be 100 µm. A width of the gold layer 309b may be 200 µm. The gold layers 309a, 309b, and 309c are formed on the same plane as one another. The gold layers 309a, and 309c generally form a mechanical support ring attachment that attaches the cap 202 to the substrate 16. The gold layer 309b is attached to the absorber 12.

Figure 28:
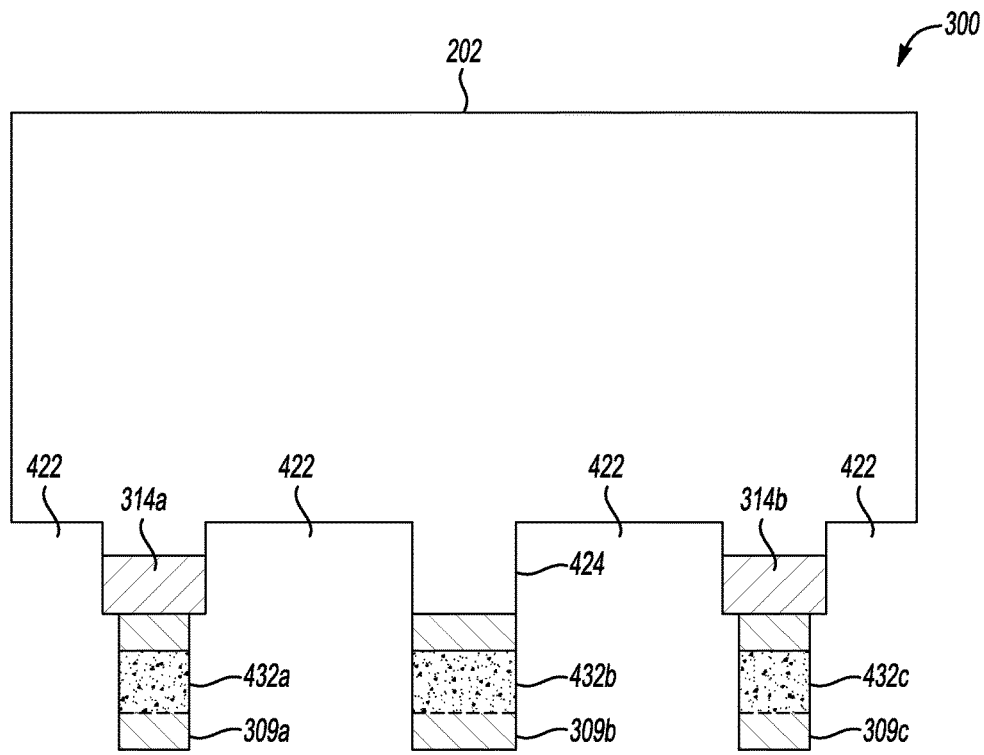

FIG. 28 depicts an optional fifth operation in providing the TEG 300 with minimal thermal shunting. A layer of polysilicon 432a, 432b, and 432c, (e.g., each having a thickness of 2 µm) may be deposited on the insulation layer 314a, the extending portion 424, and the insulation layer 314b, respectively, to assist in the eutectic bonding of the cap 202 to the substrate 16. The gold layers 309a, 309b, and 309c may be deposited on the layers of polysilicon 432a, 432b, and 432c, respectively, or vice versa. The dry etch operation as noted above in connection with FIG. 27 removes the portions 420 of the cap 202 with a gas that is selective to etch only the silicon of the cap 202 but not the spin on glass (e.g., the insulation layer 314a, 314b), nor the gold layers 309a, 309b, and 309c.

In general, there may be various thermal issues associated with the cap 202. First, in order to achieve a maximum temperature difference between the attachment of the absorber 16 to the cap 202, it is preferable to not allow heat from the cap 202 to shunt around the TEG array to heat the substrate 16 and of course having the substrate 16 cool the cap area 302. In addition, a real world heat source can only provide for a finite number of watts. Thus, to keep the TEG 300 efficiency high, the heat should not shunt around or away from the membrane (or absorber 12) or any other thermoelectric material used in the TEG 300 such as, but not limited to thermoelectric arms (e.g., first arms 14a-14b and second arms 15a-15b (as shown in FIGS. 18, 19, and 20)). It is recognized that the shunt implementation including the use of the insulation layer 314 may be used in connection with the arms 14a-14b and 15a-15b to minimize heat transfer from areas of the cap 202 to the substrate 16 to allow an increase in heat transfer for any thermoelectric material that contacts the cap 202.

While the implementation in FIG. 16 sufficiently minimizes shunting of the thermal energy, such an implementation may provide for complexity in the manufacturing process because the membrane (or absorber 12) contact area is not on the same plane as the mechanical support ring contact area (e.g., layers of solder 313 or gold). For MEMS based devices, it may be more advantageous to keep surfaces as planar as possible for ease of construction. FIGS. 24-28 illustrates a series of steps that provide for a simple construction (or manufacturing) procedure. FIGS. 24-25 depict that a trench (or cavity) 402, 404 can be dry etched into the silicon cap 202 and a spin on glass insulation material (or layer) (406 and 408) can be deposited and re-flowed to fill in the trenches 402, 404 and planarize the surface. FIG. 26 depicts the cap 202 after the insulation layer 314 (or 314a, 314b) is dry etched so that both glass and silicon exist at the bottom of the cap 202 on the same plane. As discussed previously, eutectic gold bonding may be used to attach the cap 202 to the substrate 16. The final step includes defining the membrane (or absorber 12) attachment islands as previously described in FIG. 17. The advantage of this approach is that the insulation layer 314 inserted between the substrate 16 and the cap 202 minimizes the heat flow between the cap 202 (i.e., acts as a thermal insulator) and the substrate 16 which may maintain a maximum temperature difference from the absorber 12 attachment to the substrate 16. In addition, the insulation layer 314 may reduce the thermal shorting that can occur around the attachment of the absorber 12 to the cap 202 (or away from the attachment of the absorber 12 to the cap 202). This same procedure could be done to the substrate 16 as well so that either the cap 202, or the substrate 16, or both could have the insulation layer 314.

Figure 29:
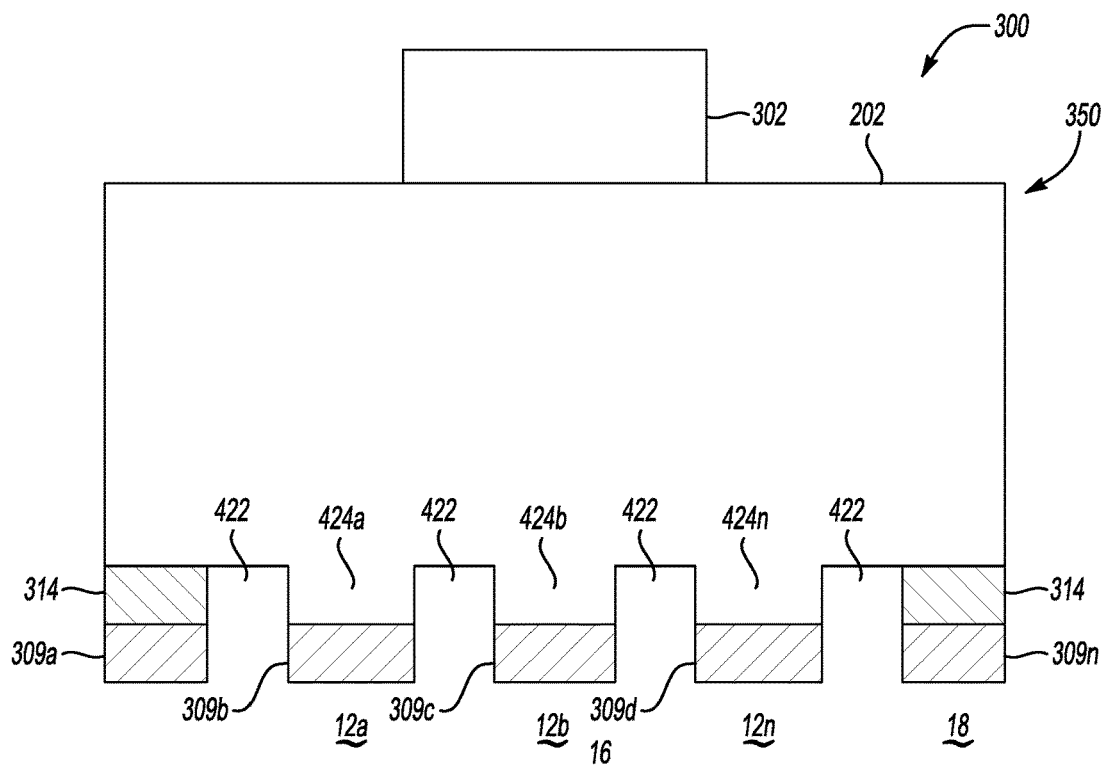
FIG. 29 depicts a thermal shunting arrangement in accordance to one embodiment.

FIG. 29 depicts a thermal shunting arrangement 350 in accordance to one embodiment. In general, the cap 202 is attached to a plurality of the absorbers 12a-12n of various detectors 10 in the array 18. The cap 202 includes a plurality of the extending portions 424a-424n that are co-planar with the insulation layer 314. As noted above, this condition aids in the attachment of the cap 202 to the absorbers and to the substrate 16 due to the generally planar surface that is formed with the insulation layer 314 and the extending portions 424 of the cap 202. The plurality of the extending portions 424a-424n contacts the plurality of gold layers 309b-309d, respectively, to secure the cap 202 to the substrate 16. The cap 202 forms the cavities 422 to separate the extending portions 424 from one another in addition and to separate a corresponding extending portion 424 that is located proximate to the insulation layer 314. The thermal shunting arrangement 350 as shown provides that the insulation layer 314 is inserted between the substrate 16 and the cap 202 to minimize the heat flow between the cap 202 and the substrate 16 which may maintain a maximum temperature difference from the absorbers 12a-12n in the array 18 to the substrate 16. In addition, the insulation layer 314 may reduce the thermal shorting that can occur away from the attachment of the absorbers 12a-12n in the array 18 to the cap 202. As shown, the cap 202 is positioned over the substrate 16. In addition, the cap 202 is attached to the substrate 16 via the coupling layer 309a and 309n (e.g., the gold layers).

Figure 30:
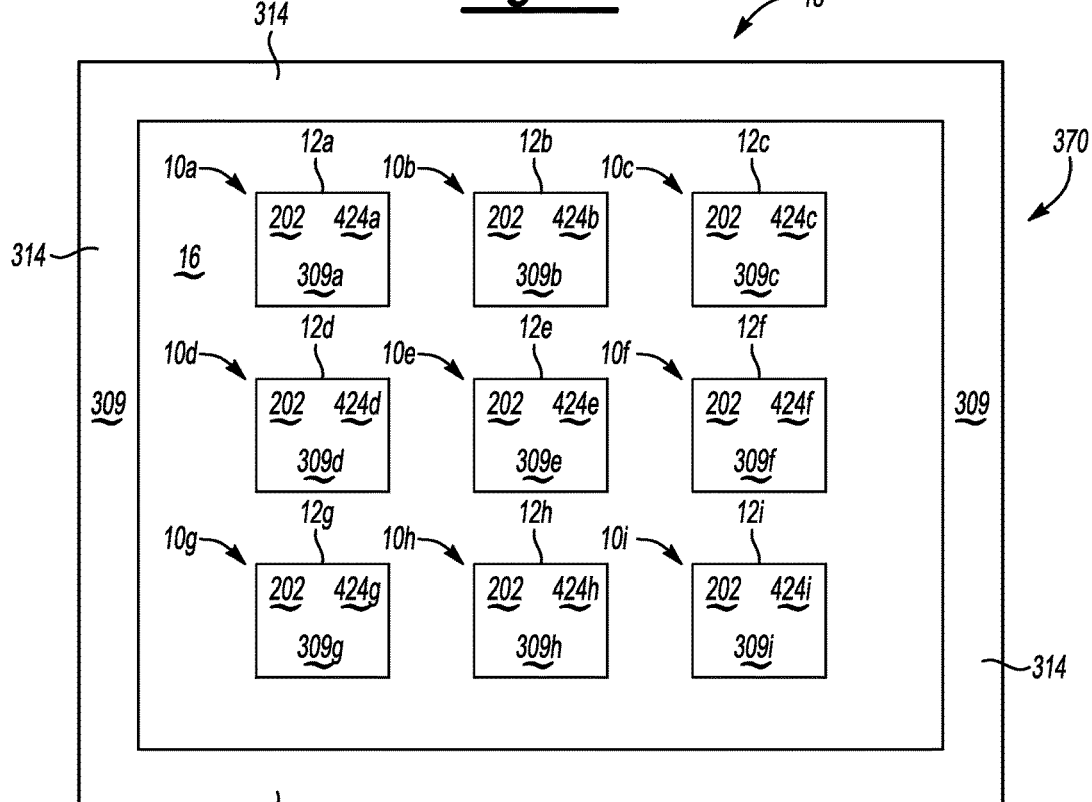
FIG. 30 depicts a top view of an array including a thermal shunting arrangement in accordance to one embodiment.

FIG. 30 depicts the array 18 including the thermal shunting arrangement 350 in accordance to one embodiment. FIG. 30 generally depicts a top view of the array 18. A wafer 370 may include any number of the arrays 18. Further, as noted above, each array 18 may include any number of detectors 10. The array 18 depicted in FIG. 30 is, for example, a 3×3 array. Thus, the array 18 includes a total of nine detectors 10a-10i where each includes a corresponding absorber 12a-12i. The cap 202 includes nine extending portions 424a-424i for contacting the absorbers 12a-12i, respectively. The insulation layer 314 and the coupling layers (or layers of gold) 309 form a seal around the detectors 10a-10i when the cap 202 is attached to the substrate 16. Each corresponding absorber 12a-12i of the corresponding detector 10a-10i is attached to the cap 202 via the extending portions 424a-424i and the layers of gold 309a-309i, respectively. While not shown because FIG. 30 illustrates a top view of the array 18, it is recognized that the insulation layer 314 is co-planar with the extending portions 424a-424i of the respective absorbers 12a-12i. Thus, the condition that the insulation layer 314 is co-planar with the extending portions 424a-424i enables a more robust attachment of the cap 202 to the absorbers 12a-12i due to the generally flat (or planar) surface at the bottom of the cap 202. This may be advantageous from a manufacturing perspective as a single cap 202 is generally attached to a plurality of absorbers 12 within the array 18. It should be recognized that the cap 202 may have, for example, an overall thickness of 500 μm, the insulating layer 314 may have, for example, an overall thickness of 100 μm, the layer of polysilicon 432a may have, for example, an overall thickness of 2 μm, and the layer of gold 309 may have an overall thickness of 1 μm. Thus, due to the relatively small package size of the foregoing, the generally flat (or planar) surface at the bottom of the cap 202 (e.g., the insulation layer 314 being co-planar with the extending portion 424 of the cap 202) aids reducing MEMS manufacturing complexity. It is also worth noting that the thermoelectric detector 10 (e.g., absorber 12) may have, for example, an overall thickness of 1 μm and that the substrate 16 may have, for example, an overall thickness of 500-600 μm. Efforts employed herein to reduce manufacturing complexity are particularly useful for the relatively small vertical heights associated with the noted elements (e.g., cap 202, insulating layer 314, layer of polysilicon 432a, layer of gold 309, absorber 12, and substrate 12.

Figure 31:
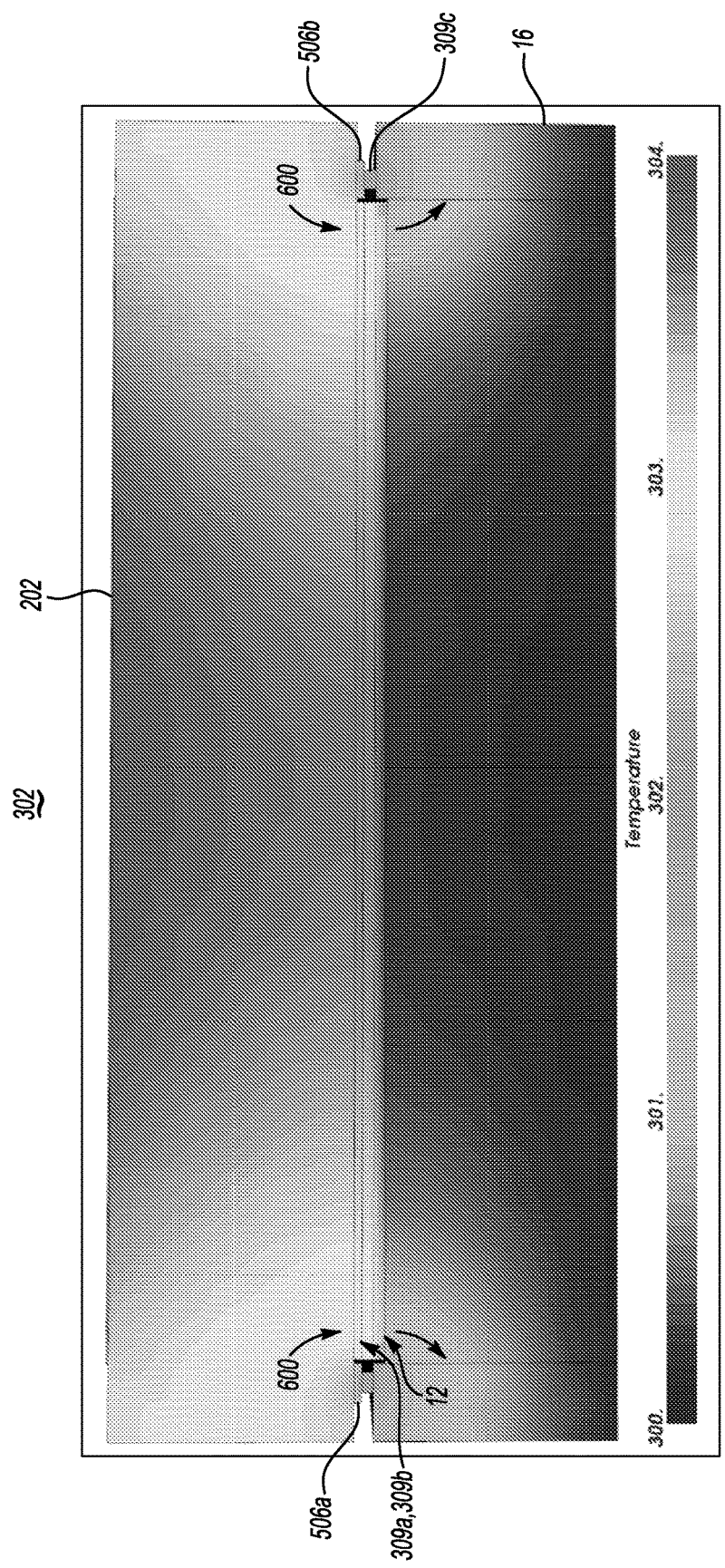
FIG. 31 depicts a first simulation that utilizes silicon as the insulation layer.

FIG. 31 depicts a first simulation that utilizes silicon as an insulation layer 506a and 506b as opposed to a glass based insulation layer. As generally shown at 600, due to the insulation layer 506 being comprised of silicon, the first simulation exhibits thermal leakage (e.g., cooling) at ends of the absorber 12 and attachment to the cap 202 in response to the application of heat from the heat generation source 302. Such leakage is not desirable as the generation of electrical energy in response to the thermal energy may not be efficient.

Figure 32:
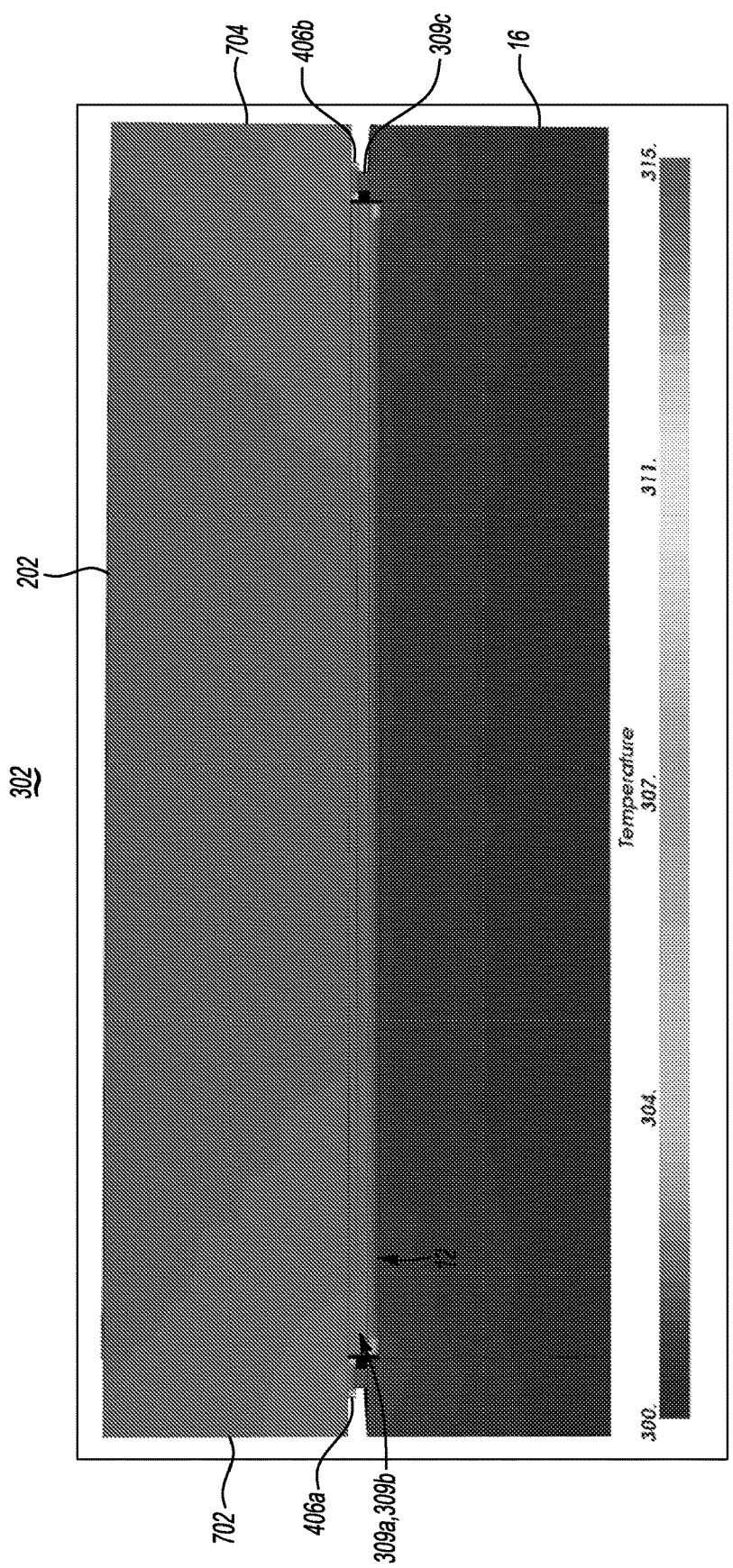
FIG. 32 depicts a second simulation that utilizes spin on glass as the insulation layer.

FIG. 32 depicts a second simulation that utilizes spin on glass as the insulation layer 314a and 314b. As shown, thermal loss are minimized in comparison to the first simulation as depicted in FIG. 29. The temperature of the cap 202 remains consistent from a first end 702 to a second 704, and, in addition, is at an overall higher temperature with the same finite thermal input condition as compared to the cap in FIG. 29. The condition ensures that the attachment to the absorber 12 receives the thermal energy with no losses thereby providing an efficient generation of electrical energy in response to the thermal energy provided by the heat generation source 302.

Heating/Cooling

All of the devices disclosed herein may be used as a heat pump to heat or cool objects. To operate the devices in this mode, a current may be placed into output terminals and the device (RTEG or TEG) may then operate as a heat pump.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A thermoelectric generator comprising:
a substrate;
a cap attached to the substrate and including a plurality of extending portions that is integrally formed with the cap, the cap being configured to receive thermal energy from a heat generating device;
a thermoelectric detector in thermal communication with the cap to generate an electrical output in response to the thermal energy; and
an insulation layer positioned between the cap and the substrate, the insulation layer being co-planar with the plurality of extending portions of the cap,
wherein the cap defines a first cavity on one side of a first extending portion of the plurality of extending portions and a second cavity on another side of the first extending portion, and
wherein the first cavity separates the first extending portion from the insulation layer and the second cavity separates the first extending portion from a second extending portion of the plurality of extending portions.

2. The thermoelectric generator of claim 1, wherein the insulation layer is positioned at an outer end of the cap.

3. The thermoelectric generator of claim 1, wherein the first extending portion and the second extending portion extend from the cap at a length that is substantially similar to one another.

4. The thermoelectric generator of claim 3, wherein the plurality of extending portions is in thermal communication with a plurality of absorbers, respectively.

5. The thermoelectric generator of claim 4, wherein a coupling layer is positioned between the plurality of extending portions and the plurality of absorbers.

6. The thermoelectric generator of claim 3 further comprising a coupling layer positioned between the insulation layer and the substrate.

7. The thermoelectric generator of claim 1, wherein the plurality of extending portions is in thermal communication with a plurality of absorbers, respectively.

8. The thermoelectric generator of claim 7, wherein a coupling layer is positioned between the plurality of extending portions and the plurality of absorbers.

9. The thermoelectric generator of claim 1 further comprising a coupling layer positioned between the insulation layer and the substrate.

10. A thermoelectric generator comprising:
a substrate;
a cap supported by the substrate and being configured to receive thermal energy from a heat generating device;
a thermoelectric detector in thermal communication with the cap to generate an electrical output in response to the thermal energy; and
an insulation layer positioned between the cap and the substrate, the insulation layer being positioned on a similar plane of a portion of the cap,
wherein the portion of the cap includes a plurality of extending portions being integrally formed with the cap,
wherein the cap defines a first cavity on one side of a first extending portion of the plurality of extending portions and a second cavity on another side of the first extending portion, and
wherein the first cavity separates the first extending portion from the insulation layer and the second cavity separates the first extending portion from a second extending portion of the plurality of extending portions.

11. The thermoelectric generator of claim 10, wherein the insulation layer is positioned at an outer end of the cap.

12. The thermoelectric generator of claim 10, wherein the first extending portion and the second extending portion extend from the cap at a length that is substantially similar to one another.

13. The thermoelectric generator of claim 10, wherein the insulation layer is positioned on the same plane of the plurality of extending portions.

14. The thermoelectric generator of claim 11, wherein the plurality of extending portions is in thermal communication with a plurality of absorbers, respectively.

15. The thermoelectric generator of claim 14, wherein a coupling layer is positioned between the plurality of extending portions and the plurality of absorbers.

16. A thermoelectric generator comprising:
a substrate;
a cap positioned over the substrate and including a plurality of extending portions that is integrally formed with the cap, the cap being configured to receive thermal energy from a heat generating device;
a thermoelectric detector in thermal communication with the cap to generate an electrical output in response to the thermal energy; and
an insulation layer positioned between the cap and the substrate, the insulation layer being co-planar with the plurality of extending portions of the cap,
wherein the cap defines a first cavity on one side of a first extending portion of the plurality of extending portions and a second cavity on another side of the first extending portion, and
wherein the first cavity separates the first extending portion from the insulation layer and the second cavity separates the first extending portion from a second extending portion of the plurality of extending portions.

17. The thermoelectric generator of claim 16, wherein the insulation layer is positioned at an outer end of the cap.

18. The thermoelectric generator of claim 16, wherein the first extending portion and the second extending portion extend from the cap at a length that is substantially similar to one another.

* * * * *